(12) United States Patent
Sato et al.

(10) Patent No.: US 8,258,771 B2
(45) Date of Patent: Sep. 4, 2012

(54) CIRCUIT DEVICE, ELECTRONIC APPARATUS, AND POWER SUPPLY METHOD

(75) Inventors: Hisao Sato, Matsumoto (JP); Atsushi Yamada, Suwa (JP); Norikazu Tsukahara, Fujimi-machi (JP); Toshikazu Kuwano, Fujimi-machi (JP); Yasuhiro Takahashi, Gifu (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/914,094

(22) Filed: Oct. 28, 2010

(65) Prior Publication Data
US 2011/0121813 A1    May 26, 2011

(30) Foreign Application Priority Data
Nov. 20, 2009    (JP) .................................. 2009-265415

(51) Int. Cl.
*H02J 1/00* (2006.01)
(52) U.S. Cl. .......................... 323/349; 323/318; 326/112
(58) Field of Classification Search .......................... None
See application file for complete search history.

(56) References Cited

U.S. PATENT DOCUMENTS

| | | | |
|---|---|---|---|
| 5,378,940 A | 1/1995 | Knight, Jr. et al. | |
| 5,422,582 A | 6/1995 | Avery et al. | |
| 5,459,414 A | 10/1995 | Dickinson | |
| 5,473,269 A | 12/1995 | Dickinson | |
| 5,473,270 A | 12/1995 | Denker | |
| 5,477,164 A * | 12/1995 | Denker | 326/21 |
| 6,542,002 B2 | 4/2003 | Jang et al. | |
| 7,289,002 B2 * | 10/2007 | Jeon et al. | 331/117 FE |
| 2005/0035823 A1 * | 2/2005 | Lee et al. | 331/167 |
| 2007/0222489 A1 * | 9/2007 | Kousai | 327/156 |

FOREIGN PATENT DOCUMENTS

| | | |
|---|---|---|
| JP | A 7-15317 | 1/1995 |
| JP | A 7-15318 | 1/1995 |
| JP | A 7-15319 | 1/1995 |
| JP | A 7-221631 | 8/1995 |
| JP | A 2002-325031 | 11/2002 |
| JP | A 2009-278443 | 11/2009 |

OTHER PUBLICATIONS

Younis, "Asymptotically Zero Energy Computing Using Split-Level Charge Recovery Logic," A.I. Technical Report No. 1500, Jun. 1994.
Anuar et al.; "Two Phase Clocked Adiabatic Static CMOS Logic and its Logic Family;" Journal of Semiconductor Technology and Science; vol. 10; No. 1; Mar. 2010.

* cited by examiner

*Primary Examiner* — Shawki S Ismail
*Assistant Examiner* — Crystal L Hammond
(74) *Attorney, Agent, or Firm* — Oliff & Berridge, PLC

(57) ABSTRACT

A circuit device includes: a power supply circuit; and a logic circuit, the power supply circuit supplying a first power supply voltage and a second power supply voltage to the logic circuit, the first power supply voltage supplied by the power supply circuit periodically changing with a first reference voltage as a reference voltage, the second power supply voltage supplied by the power supply circuit periodically changing with a second reference voltage as a reference voltage, the power supply circuit supplying, due to resonance, the first power supply voltage and the second power supply voltage that repeat a first period during which a voltage difference between the first power supply voltage and the second power supply voltage is decreasing and a second period during which the voltage difference is increasing, and the logic circuit performing adiabatic circuit operation with the supply of the first and the second power supply voltage.

16 Claims, 24 Drawing Sheets

CIRCUIT DEVICE, ELECTRONIC APPARATUS, AND POWER SUPPLY METHOD

The present application claims a priority based on Japanese Patent Application No. 2009-265415 filed on Nov. 20, 2009, the contents of which are incorporated herein by reference.

BACKGROUND

1. Technical Field

The present invention relates to a circuit device, an electronic apparatus, a power supply method, and the like.

2. Related Art

As a technique of reducing the power consumption of a logic circuit, an adiabatic logic circuit has been known (for example, a technique described in JP-A-2002-325031). In the adiabatic logic circuit, power consumption caused by the drain loss of a transistor is reduced by changing a power supply voltage.

However, when a power supply circuit that supplies the power supply voltage to the adiabatic logic circuit does not perform electric power regeneration, the power consumption cannot be sufficiently reduced. That is, the charge recovered from the adiabatic logic circuit to the power supply circuit is consumed without being regenerated by the power supply circuit, so that the power consumption in the power supply circuit increases.

SUMMARY

An advantage of some aspects of the invention is to provide a circuit device that reduces power consumption through electric power regeneration, an electronic apparatus, a power supply method, and the like.

A first aspect of the invention relates to a circuit device including: a power supply circuit; and a logic circuit, the power supply circuit supplying a first power supply voltage and a second power supply voltage to the logic circuit, the first power supply voltage supplied by the power supply circuit periodically changing with a first reference voltage as a reference voltage, the second power supply voltage supplied by the power supply circuit periodically changing with a second reference voltage as a reference voltage, the power supply circuit supplying, due to resonance, the first power supply voltage and the second power supply voltage that repeat a first period during which a voltage difference between the first power supply voltage and the second power supply voltage is decreasing and a second period during which the voltage difference is increasing, and the logic circuit performing adiabatic circuit operation with the supply of the first power supply voltage and the second power supply voltage.

According to the first aspect of the invention, the first power supply voltage that periodically changes with the first reference voltage as a reference voltage is supplied, and the second power supply voltage that periodically changes with the second reference voltage as a reference voltage is supplied. The first power supply voltage and the second power supply voltage that repeat the first period during which the voltage difference is decreasing and the second period during which the voltage difference is increasing are supplied due to resonance. This enables a reduction in power consumption and the like through electric power regeneration.

A second aspect of the invention relates to a circuit device including: a power supply circuit; and a logic circuit, the power supply circuit supplying a first power supply voltage and a second power supply voltage to the logic circuit, the first power supply voltage periodically changing with a first reference voltage as a reference voltage, the second power supply voltage periodically changing with a second reference voltage as a reference voltage, the first power supply voltage and the second power supply voltage repeating a first period during which a voltage difference between the first power supply voltage and the second power supply voltage is decreasing and a second period during which the voltage difference is increasing, the second power supply voltage becoming a local maximum value during a period between a first local maximum value of the first power supply voltage and a second local maximum value subsequent to the first local maximum value and becoming a local minimum value during a period between a first local minimum value of the first power supply voltage and a second local minimum value subsequent to the first local minimum value, and the logic circuit performing adiabatic circuit operation with the supply of the first power supply voltage and the second power supply voltage.

According to the second aspect of the invention, the first power supply voltage that periodically changes with the first reference voltage as a reference voltage is supplied, and the second power supply voltage that periodically changes with the second reference voltage as a reference voltage is supplied. The first period during which the voltage difference between the first power supply voltage and the second power supply voltage is decreasing and the second period during which the voltage difference is increasing are repeated. The second power supply voltage becomes the local maximum value during the period between the first local maximum value of the first power supply voltage and the second local maximum value subsequent to the first local maximum value and becomes the local minimum value during the period between the first local minimum value of the first power supply voltage and the second local minimum value subsequent to the first local minimum value. This enables adiabatic circuit operation and the like of the logic circuit.

According to the first or second aspect of the invention, the first reference voltage and the second reference voltage may be different reference voltages.

By doing this, the first power supply voltage and the second power supply voltage that are different power supply voltages can be supplied. Thus, the logic circuit can perform adiabatic circuit operation with the supply of the first power supply voltage and the second power supply voltage that are different power supply voltages.

According to the first or second aspect of the invention, the circuit device may be configured such that the logic circuit includes an inverter, that the first power supply voltage is supplied to a source electrode of a first conductivity type transistor of the inverter not via another active element, and that the second power supply voltage is supplied to a source electrode of a second conductivity type transistor of the inverter not via another active element.

By doing this, the logic circuit can include an inverter. The first power supply voltage can be supplied to the source electrode of the first conductivity type transistor of the inverter not via another active element, and the second power supply voltage can be supplied to the source electrode of the second conductivity type transistor not via another active element.

According to the first or second aspect of the invention, the first power supply voltage and the second power supply voltage may be sine waves opposite in phase from each other.

By doing this, it is possible to supply the first power supply voltage and the second power supply voltage that repeat the first period during which the voltage difference is decreasing and the second period during which the voltage difference is increasing.

According to the first or second aspect of the invention, the circuit device may be configured such that the logic circuit has a first conductivity type transistor and a second conductivity type transistor, and that a minimum voltage difference between the first power supply voltage and the second power supply voltage is smaller than a threshold voltage of the first conductivity type transistor and a threshold voltage of the second conductivity type transistor.

By doing this, the minimum voltage difference between the first power supply voltage and the second power supply voltage can be smaller than a threshold voltage of the first conductivity type transistor and a threshold voltage of the second conductivity type transistor.

According to the first or second aspect of the invention, the logic circuit may be input with an input signal having an edge during the second period.

By doing this, the input signal having an edge during the second period in which the voltage difference between the first power supply voltage and the second power supply voltage is increasing is input, so that the logic circuit can perform adiabatic circuit operation.

According to the first or second aspect of the invention, the first power supply voltage and the second power supply voltage may be sine waves opposite in phase from each other, and the logic circuit may be input with an input signal having an edge at a timing in which the voltage difference between the first power supply voltage and the second power supply voltage is minimized.

By doing this, the input signal having an edge at the timing in which the voltage difference between the first power supply voltage and the second power supply voltage is minimized is input, so that the logic circuit can perform adiabatic circuit operation.

According to the first or second aspect of the invention, the first power supply voltage and the second power supply voltage are generated by one tank circuit.

By doing this, the first power supply voltage and the second power supply voltage are generated by one tank circuit, so that the first power supply voltage and the second power supply voltage can be supplied due to resonance.

According to the first or second aspect of the invention, the circuit device may be configured such that the tank circuit is configured with a capacitor, a first inductor, and a second inductor, that the power supply circuit outputs the first power supply voltage from a first output node of the tank circuit and outputs the second power supply voltage from a second output node, that the capacitor is disposed between the first output node and the second output node, that the first inductor is connected at one end to the first output node, and that the second inductor is connected at one end to the second output node.

According to the first or second aspect of the invention, the power supply circuit may include at least one of an exciting transistor whose one end is connected to the first output node and an exciting transistor whose one end is connected to the second output node.

According to the first or second aspect of the invention, the circuit device may be configured such that the power supply circuit has a first driver whose duty of a period during which the first driver drives with a first DC voltage and a period during which it drives with a second DC voltage is set to a first duty and a second driver whose duty of a period during which the second driver drives with the first DC voltage and a period during which it drives with the second DC voltage is set to a second duty, that the first driver is set with the first duty as a duty for setting the first reference voltage and outputs a first output voltage to the other end of the first inductor, and that the second driver is set with the second duty, different from the first duty, as a duty for setting the second reference voltage and outputs a second output voltage to the other end of the second inductor.

According to the first or second aspect of the invention, a tank circuit that generates the first power supply voltage and the second power supply voltage with one tank circuit can be realized.

According to the first or second aspect of the invention, the first power supply voltage may be generated by a first tank circuit, and the second power supply voltage may be generated by a second tank circuit.

By doing this, the first power supply voltage is generated by the first tank circuit, and the second power supply voltage is generated by the second tank circuit, so that the first power supply voltage and the second power supply voltage can be supplied due to resonance.

According to the first or second aspect of the invention, the circuit device may be configured such that the first tank circuit is configured with a first capacitor and a first inductor, that the second tank circuit is configured with a second capacitor and a second inductor, that the power supply circuit outputs the first power supply voltage from a first output node of the first tank circuit and outputs the second power supply voltage from a second output node of the second tank circuit, that the first capacitor is disposed between the first output node and a ground node, that the first inductor is connected at one end to the first output node, that the second capacitor is disposed between the second output node and the ground node, and that the second inductor is connected at one end to the second output node.

According to the first or second aspect of the invention, a tank circuit that generates the first power supply voltage with the first tank circuit and generates the second power supply voltage with the second tank circuit can be realized.

A third aspect of the invention relates to an electronic apparatus including the circuit device according to the first aspect of the invention.

A fourth aspect of the invention relates to a power supply method that supplies power supply voltages to a logic circuit, including: supplying to the logic circuit a first power supply voltage and a second power supply voltage for performing adiabatic circuit operation by the logic circuit; supplying, as the first power supply voltage, a voltage that periodically changes with a first reference voltage as a reference voltage; supplying, as the second power supply voltage, a voltage that periodically changes with a second reference voltage as a reference voltage; and supplying, due to resonance, the first power supply voltage and the second power supply voltage that repeat a first period during which a voltage difference between the first power supply voltage and the second power supply voltage is decreasing and a second period during which the voltage difference is increasing.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described in detail. The embodiment described below is not intended to unreasonably limit the scope of the invention as set forth in the claims, and not all of the configurations described in the embodiment are necessarily indispensable as means of solving the invention.

1. COMPARATIVE EXAMPLES

In an adiabatic logic circuit as described above, there is the task of reducing the power consumption of a power supply circuit. Also, the adiabatic logic circuit has the problem that it sometimes requires a diode for holding an output voltage of the logic circuit. Hereinafter, comparative examples of the embodiment are shown in FIGS. 1A to 3B, and these things will be described. For simplifying the description, an inverter will be described as an example of the adiabatic logic circuit.

Figure 1A:
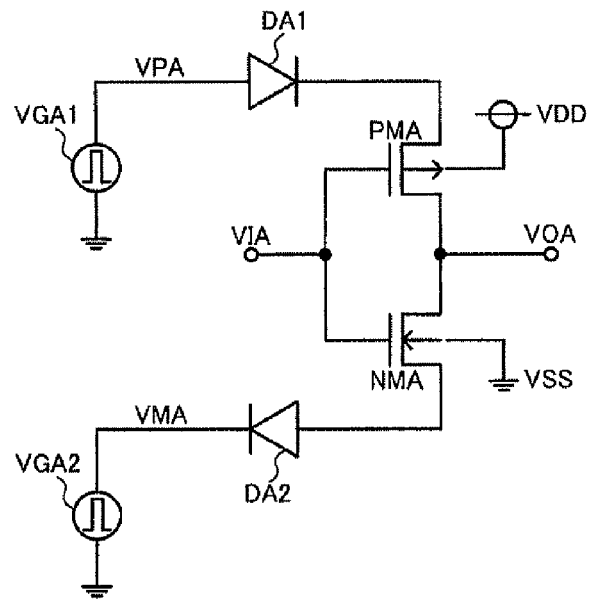
FIGS. 1A and 1B show a first comparative example.

FIG. 1A shows a first comparative example. The comparative example includes power supply circuits VGA1 and VGA2, diodes DA1 and DA2, a PMOS transistor PMA, and an NMOS transistor NMA. The transistors PMA and NMA constitute an inverter. A power supply voltage VPA from the power supply circuit VGA1 is supplied to a source electrode of the transistor PMA via the diode DA1 as an active element. A power supply voltage VMA from the power supply circuit VGA2 is supplied to a source electrode of the transistor NMA via the diode DA2 as an active element.

Figure 1B:
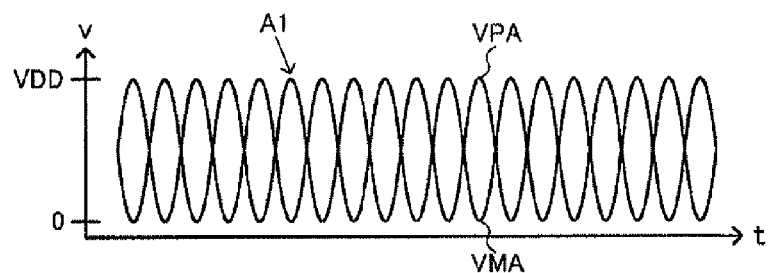
Figure 1B:
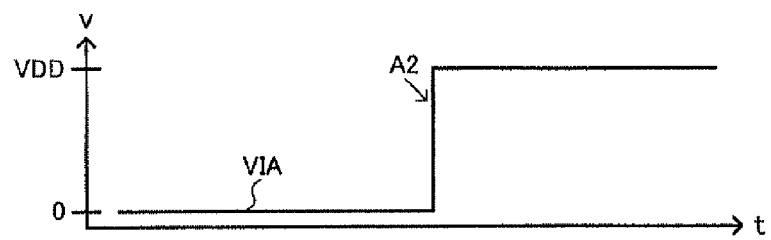
Figure 1B:
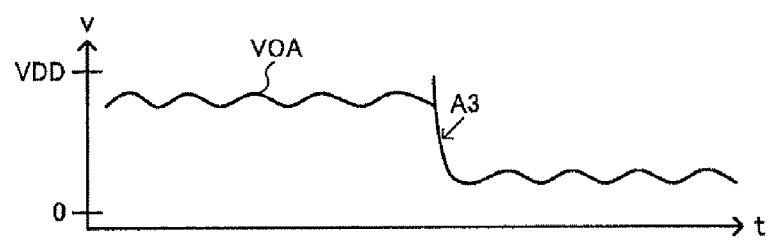

FIG. 1B shows voltage waveform examples of the first comparative example. As shown by A1 in FIG. 1B, a sine-wave voltage is supplied as the power supply voltage VPA, and a sine-wave voltage opposite in phase with VPA is supplied as the power supply voltage VMA. Each of the amplitudes between the peaks and valleys of the power supply voltages VPA and VMA is a DC power supply voltage VDD. As shown by A2, it is assumed in this case that an input voltage VIA of the inverter changes from a low level to a high level. The logic level of the input power supply VIA changes at a timing in which the voltages VPA and VMA intersect. Then, as shown by A3, an output voltage VOA of the inverter changes according to the power supply voltage VMA and changes adiabatically from the high level to the low level.

In this case, during a period in which the input voltage VIA does not change, the logic level of the output voltage VOA needs to be kept constant. For example, the transistor PMA is turned on during a period in which the input voltage VIA is at the low level, and the power supply voltage VPA is output to the output voltage VOA. Since voltages between 0V and VDD alternately appear in the power supply voltage VPA, the output voltage VOA needs to be kept at the high level via the diode DA1. In this manner, in the first comparative example, the diode as an active element is required between the power supply circuit and the transistor. Since a power supply is supplied via the diode, voltage drop due to a forward voltage VF of the diode is caused. Therefore, the output voltage VOA changes not from 0 to VDD but from VF to VDD−VF, which causes a problem of degrading the noise immunity or the like.

Figure 2A:
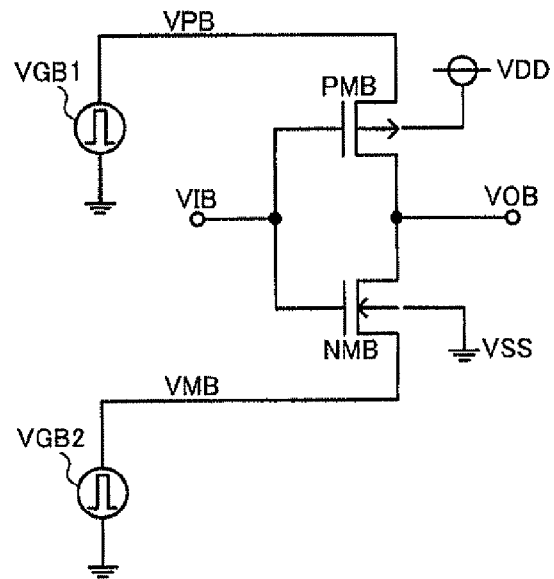
FIGS. 2A and 2B show a second comparative example.

FIG. 2A shows a second comparative example. The comparative example includes power supply circuits VGB1 and VGB2, a PMOS transistor PMB, and an NMOS transistor NMB. The transistors PMB and NMB constitute an inverter. Power supply voltages VPB and VMB from the power supply circuits VGB1 and VGB2 are supplied to source electrodes of the transistors PMB and NMB not via an active element (circuit element) such as a diode.

Figure 2B:
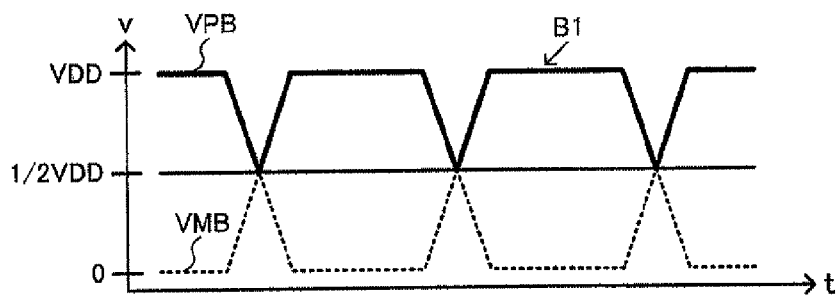
Figure 2B:
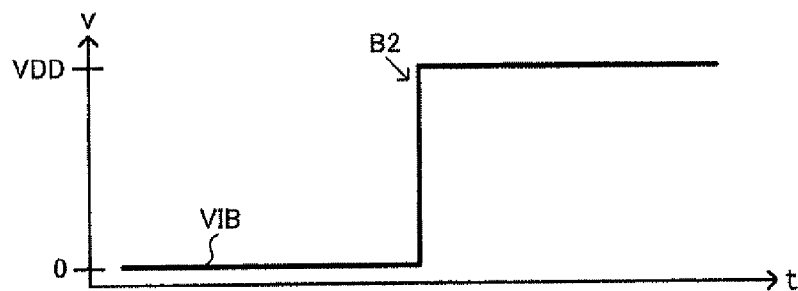
Figure 2B:
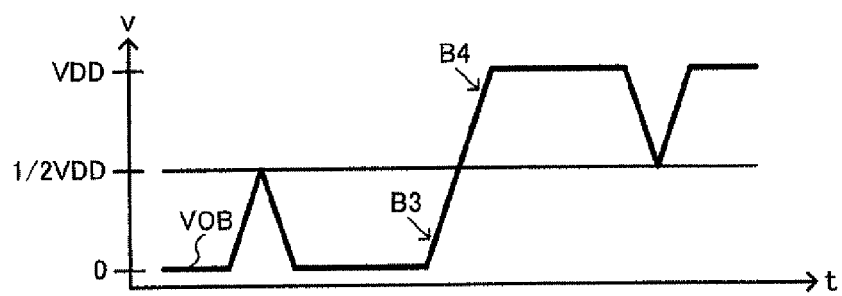

FIG. 2B shows voltage waveform examples of the second comparative example. As shown by B1 in FIG. 2B, a trapezoidal wave in a voltage range from VDD/2 to VDD is supplied as the power supply voltage VPB. As the power supply voltage VMB, a triangular wave in a voltage range from 0V to VDD/2 is supplied. The power supply voltages VPB and VMB are voltages that change axisymmetrically about the voltage VDD/2. As shown by B2, it is assumed in this case that an input voltage VIB of the inverter changes from the low level to the high level. The logic level of the input voltage VIB changes at a timing in which the power supply voltage VPB is minimized (the power supply voltage VMB is maximized). Then, an output voltage VOB of the inverter changes from 0V to VDD/2 with an increase in the power supply voltage VMB as shown by B3 and changes from VDD/2 to VDD with an increase in the power supply voltage VPB as shown by B4. In this manner, the output voltage VOB changes adiabatically from the low level to the high level.

In this case, since the power supply voltages VPB and VMB change in the ranges from VDD/2 to VDD and 0V to VDD/2, respectively, the logic level of the output voltage VOB is kept constant during a period in which the input voltage VIB does not change. Therefore, a diode between the power supply circuit and the transistor is not required. However, since the trapezoidal wave or triangular wave is used as a power supply voltage, electric power regeneration using the power supply circuit becomes difficult.

Figure 3A:
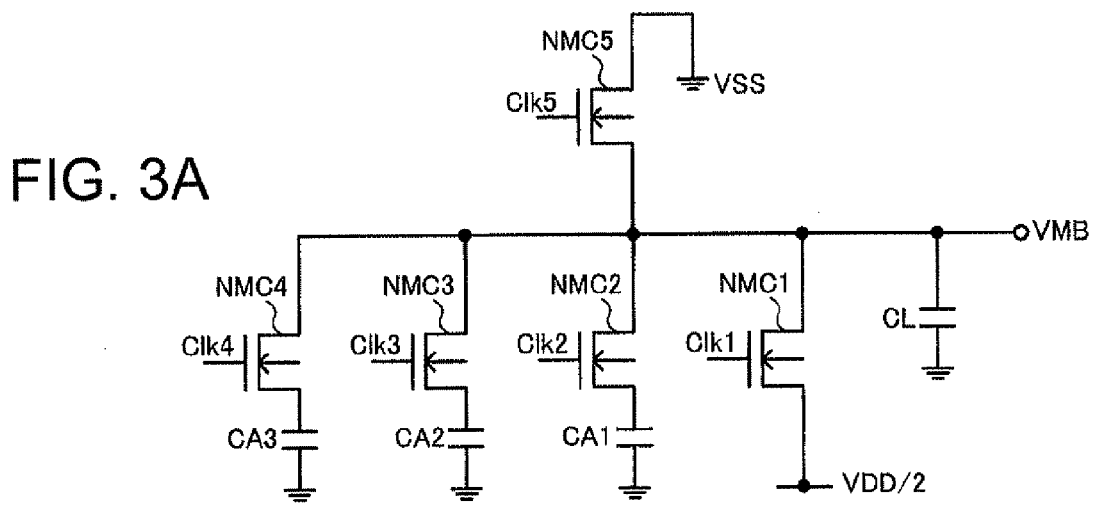
FIGS. 3A and 3B show a configuration example of a power supply circuit of the second comparative example.

This will be described with reference to FIGS. 3A and 3B. FIG. 3A shows a configuration example of the power supply circuit VGB2 that outputs a power supply voltage with a triangular wave. The configuration example includes NMOS transistors NMC1 to NMC5 and capacitors CA1 to CA3. Clock Clk1 to Clk5 are respectively input to the transistors NMC1 to NMC5. In FIG. 3A, the load capacitance including the capacitance of the adiabatic logic circuit is schematically shown as a capacitor CL.

Figure 3B:
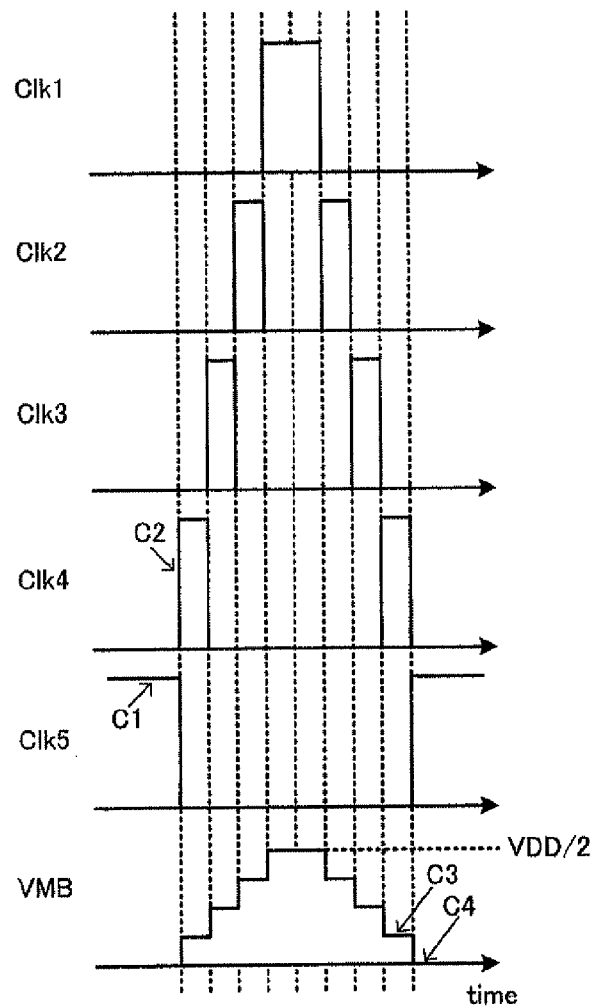

As shown by C1 in FIG. 3B, the transistor NMC5 is turned on when the clock Clk5 is at a high level, and 0V is output as the power supply voltage VMB. As shown by C2, the transistor NMC4 is turned on when the clock Clk4 goes to the high level, and the power supply voltage VMB increases due to the charge of the capacitor CA3. Then, NMC3 to NMC1 are sequentially turned on; the power supply voltage VMB increases stepwise to VDD/2; NMC2 to NMC5 are sequentially turned on; and the power supply voltage VMB decreases stepwise to 0V. In this manner, a power supply voltage with an approximated triangular wave can be supplied.

In this case, charges are exchanged between the load capacitance CL and the capacitors CA1 to CA3, so that part of the charge returned from the adiabatic logic circuit to the power supply circuit is regenerated. However, some of the charge returned to the power supply circuit cannot be regenerated. Specifically as shown by C3 in FIG. 3B, the charge of the load capacitance CL when the transistor NMC4 is turned on is drained to the ground when the transistor NMC5 is turned on as shown by C4. Therefore, the charge is not regenerated, which increases the power consumption of the power supply circuit.

2. CONFIGURATION EXAMPLES

Figure 4:
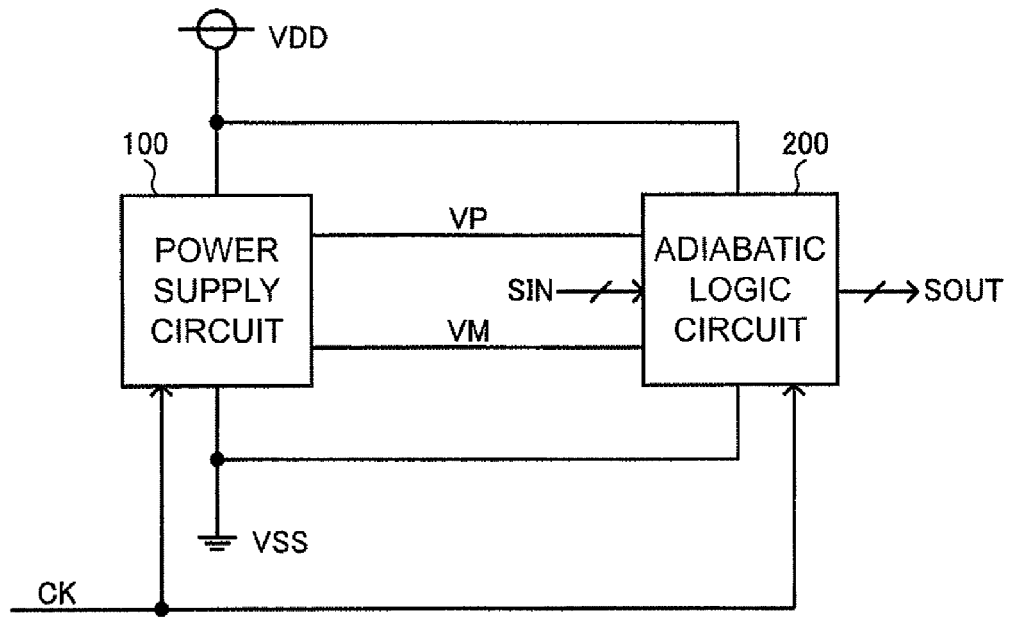
FIG. 4 shows a configuration example of a circuit device of an embodiment.

FIG. 4 shows a configuration example of the embodiment that can solve the above problems. The configuration example includes a power supply circuit 100 and an adiabatic logic circuit 200 (adiabatic circuit; a logic circuit in the broad sense). The embodiment is not limited to the configuration example, and various modifications such as omitting some of the constituents or adding another constituent can be implemented.

The power supply circuit 100 supplies a first power supply voltage VP (first power supply clock; a high voltage-side power supply voltage) and a second power supply voltage VM (second power supply clock; a low voltage-side power supply voltage) to the adiabatic logic circuit. The power supply voltages VP and VM are voltages for performing adiabatic circuit operation (adiabatic operation) by the adiabatic logic circuit, and are time varying voltages.

More specifically, the power supply voltages VP and VM are voltages that periodically change with different reference voltages as references and are generated by a tank circuit (for example, an LC tank circuit). For example, the power supply circuit 100 generates the power supply voltages VP and VM each having a frequency based on a clock CK (for example, the same frequency as that of CK). The clock CK is input from a not-shown control circuit or the like. Alternatively, the power supply circuit 100 may include a not-shown clock generating circuit, and the clock CK may be supplied from the clock generating circuit. When the power supply voltages VP and VM are generated by a self-oscillation circuit (for example, an LC tank circuit), the self-oscillation circuit may generate the clock CK. For example, the clock CK is used for an excitation clock of a tank circuit described later with reference to FIG. 11 and the like.

The adiabatic logic circuit 200 receives the power supply voltages VP and VM from the power supply circuit 100 to perform adiabatic circuit operation. Specifically, the adiabatic logic circuit 200 uses a power supply voltage that changes at a cycle (gradient) sufficiently longer than a time constant determined by the on-resistance of a transistor and load capacitance of the logic circuit to perform adiabatic charge and discharge that reduces heat loss in the logic circuit. Moreover, the adiabatic logic circuit 200 regenerates charge to charge and be discharged from the load capacitance (for example, a gate capacitance or wiring capacitance) of the logic circuit with a power supply circuit that can store and regenerate electric power, thereby performing low power consumption.

More specifically, an input signal synchronized with the power supply voltages VP and VM (for example, frequency synchronization or phase synchronization) is input to the logic circuit of the adiabatic logic circuit 200. For example, the clock CK described above is input to the adiabatic logic circuit 200. A signal synchronized with the clock CK is input as an input signal of the logic circuit, so that an input signal synchronized with the power supply voltages VP and VM is input to the logic circuit. The frequency of the input signal is, for example, the same frequency as that of the clock CK, or a frequency that is an integer sub-multiple of the frequency of the clock CK. For example, the frequency is within a range from 1 MHz to 10 kHz.

For example, the adiabatic logic circuit 200 is configured with logic gates such as an inverter, an AND circuit, and an OR circuit (combinational logic circuit). The adiabatic logic circuit 200 may include a holding circuit (memory circuit) such as a flip-flop circuit or a latch circuit. Then, a sequential circuit may be configured with a logic gate and a holding circuit. The adiabatic logic circuit 200 may be configured only with a circuit that performs adiabatic circuit operation or may be configured with both a circuit that performs adiabatic circuit operation and a circuit that performs non-adiabatic circuit operation (typical logic circuit operation or CMOS circuit operation).

3. ADIABATIC LOGIC CIRCUIT AND POWER SUPPLY CIRCUIT

Figure 5:
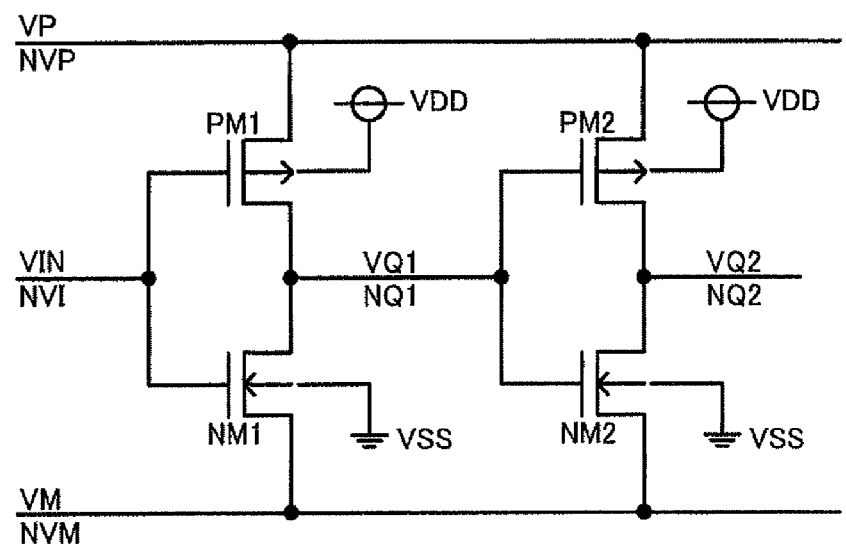
FIG. 5 shows a detailed configuration example of an adiabatic logic circuit.

As described above, the power supply circuit 100 generates due to resonance the power supply voltages VP and VM that have different reference voltages as references and supplies them to the adiabatic logic circuit 200. This enables electric power regeneration by the power supply circuit and omission of a diode of the adiabatic logic circuit. With reference to FIGS. 5 to 7, such a power supply circuit and an adiabatic logic circuit will be described.

FIG. 5 shows a detailed configuration example of the adiabatic logic circuit 200. The configuration example includes PMOS transistors PM1 and PM2 (first conductivity type transistors in the broad sense) and NMOS transistors NM1 and NM2 (second conductivity type transistors in the broad sense). Hereinafter, a two-stage inverter will be described as an example among logic circuits that can be included in the adiabatic logic circuit 200. In the embodiment, however, the adiabatic logic circuit 200 may include another logic circuit.

Specifically, the transistors PM1 and NM1 constitute a preceding inverter, while the transistors PM2 and NM2 constitute a subsequent inverter. That is, a first power supply node NVP is connected to source terminals of the transistors PM1 and PM2, and a second power supply node NVM is connected to source terminals of the transistors NM1 and NM2. An input node NV1 is connected to gate terminals of the transistors PM1 and NM1, and an output node NQ1 is connected to drain terminals of the transistors PM1 and NM1. The output node NQ1 is connected to gate terminals of the transistors PM2 and NM2, and an output node NQ2 is connected to drain terminals of the transistors PM2 and NM2. The power supply voltages VP and VM from the power supply circuit 100 are respectively supplied to the power supply nodes NVP and NVM. An input signal VIN is supplied to the input node NV1.

As shown in FIG. 5, the DC voltage VDD is supplied to the well (or substrate) of the transistors PM1 and PM2, and a ground voltage VSS is supplied to the substrate (well) of the transistors NM1 and NM2. Alternatively, the power supply voltage VP may be supplied to the well (back gate) of the transistors PM1 and PM2, and the power supply voltage VM may be supplied to the substrate (back gate) of the transistors NM1 and NM2.

Figure 6A:
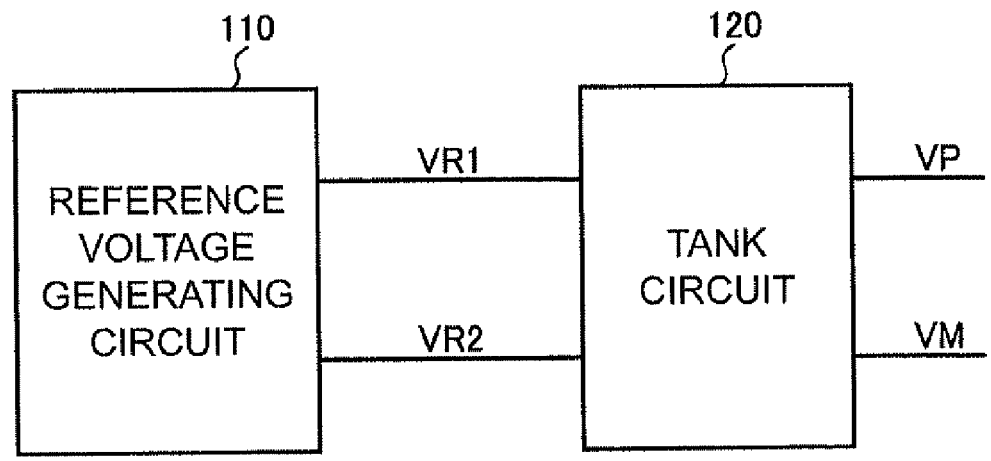
FIGS. 6A and 6B each show a detailed configuration example of a power supply circuit.
Figure 7:
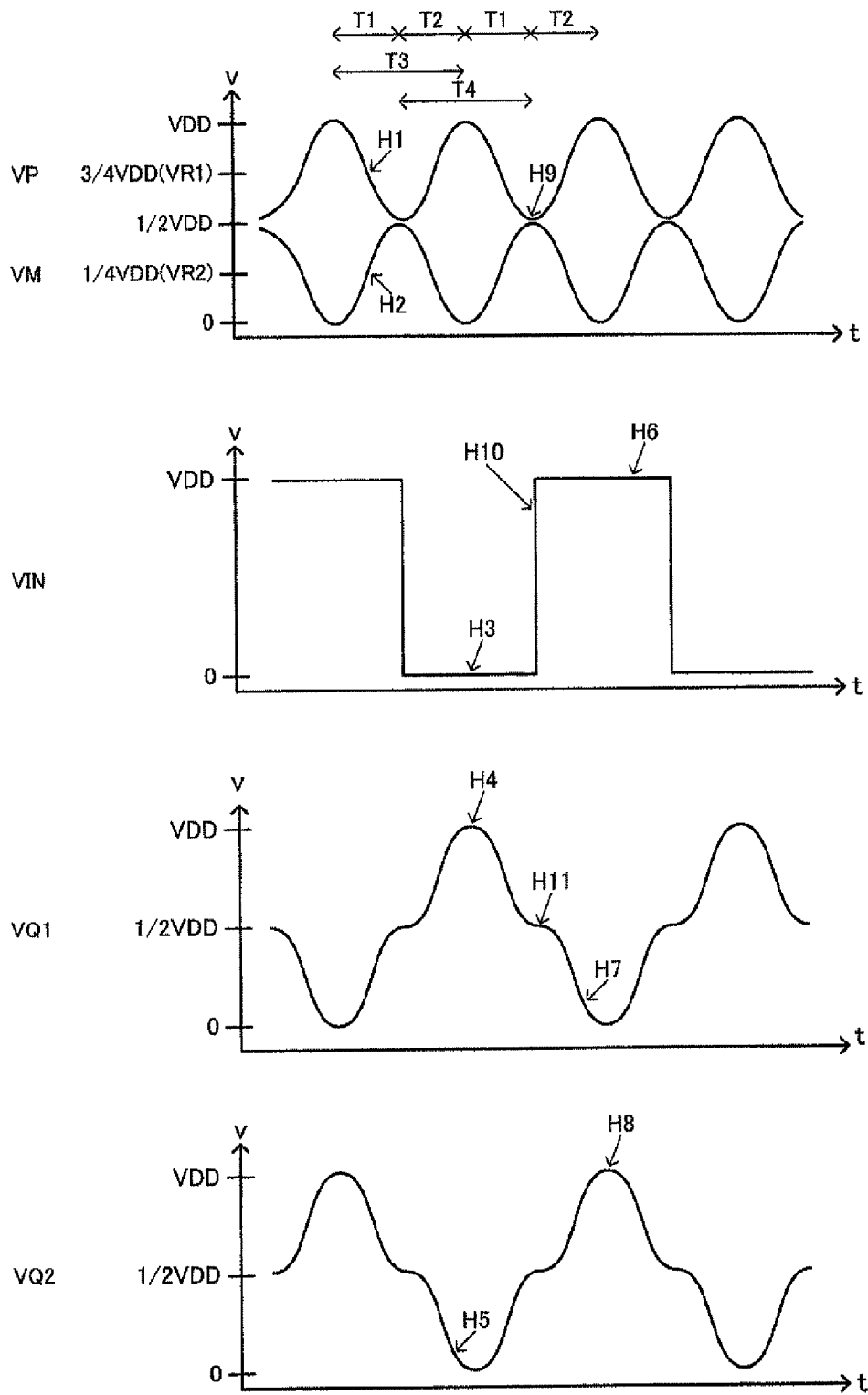
FIG. 7 shows voltage waveform examples of the embodiment.

FIG. 6A shows a first detailed configuration example of the power supply circuit 100. The configuration example includes a reference voltage generating circuit 110 and a tank circuit 120 (single tank circuit).

The reference voltage generating circuit 110 outputs a first reference voltage VR1 and a second reference voltage VR2 different in voltage from the first reference voltage VR1. The reference voltages VR1 and VR2 are voltages serving as references of the power supply voltages VP and VM that periodically change. For example, the reference voltage generating circuit 110 is configured with a switching regulator (for example, a switched capacitor regulator), and the switching regulator generates the reference voltages VR1 and VR2. Alternatively, the reference voltage generating circuit 110 may be configured with a driver that outputs the high level voltage (VDD) and the low level voltage (VSS). Then, the driver may output the high level voltage and the low level voltage at a duty corresponding to the reference voltages VR1 and VR2 to thereby generate the reference voltages VR1 and VR2 effectively (as effective values). As will be described later with reference to FIG. 11 and the like, the reference voltage generating circuit 110 can include a first reference voltage generating circuit that outputs the reference voltage VR1 to the tank circuit 120 and a second reference voltage generating circuit that outputs the reference voltage VR2 to the tank circuit 120.

The tank circuit 120 outputs the first power supply voltage VP and the second power supply voltage VM due to resonance of one tank circuit (single resonance). As described above, the power supply voltages VP and VM generated by the tank circuit 120 are power supply voltages that periodically change with the reference voltages VR1 and VR2 as references. Specifically, the power supply voltages VP and VM each have a voltage waveform in which a sine wave, rectangular wave, a trapezoidal wave, a triangular wave, or the like is repeated periodically. The power supply voltages VP and VM have voltage waveforms that are axisymmetrical about a third reference voltage (for example, (VR1+VR2)/2). Alternatively, the power supply voltages VP and VM may have voltage waveforms opposite in phase. For example, the tank circuit 120 can be configured with an LC current exciting circuit, an LC voltage exciting circuit, an LC bistable circuit, a crystal oscillation circuit, or the like.

Figure 6B:
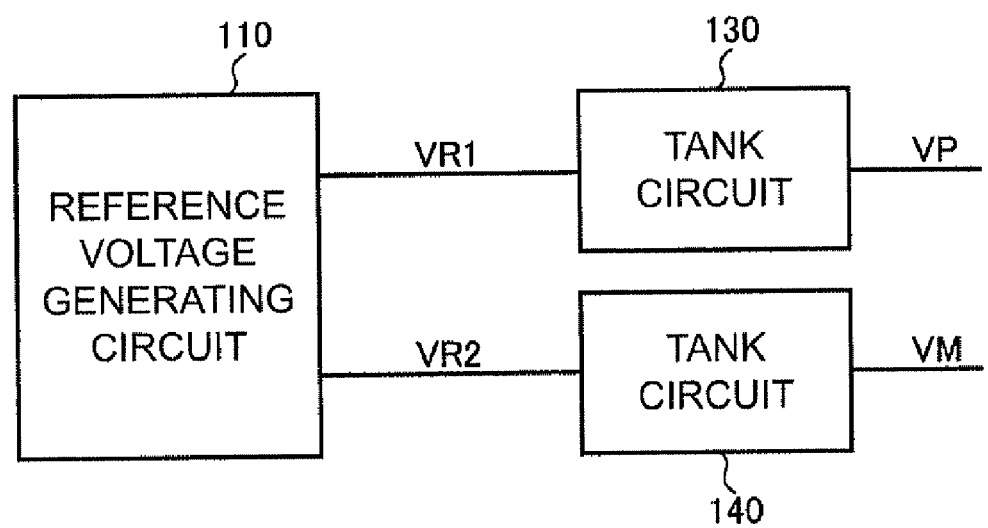

FIG. 6B shows a second detailed configuration example of the power supply circuit 100. The configuration example includes the reference voltage generating circuit 110, a first tank circuit 130, and a second tank circuit 140. The reference voltage generating circuit described with reference to FIG. 6A is denoted by the same reference numeral, and the description thereof is omitted as appropriate.

The tank circuit 130 outputs the first power supply voltage VP due to resonance, and the tank circuit 140 outputs the second power supply voltage VM due to resonance. That is, two tank circuits (dual tank circuit) output the power supply voltages due to respective resonances (dual resonance). Specifically, the tank circuits 130 and 140 generate the power supply voltages that periodically change with the reference voltages VR1 and VR2 as references similarly to the tank circuit 120 described above. For example, the tank circuits 130 and 140 can be configured with an LC current exciting circuit or an LC voltage exciting circuit.

All the constituents of the tank circuit may be included in the power supply circuit 100, or some of the constituents may be included in the power supply circuit 100. For example, when the tank circuit is an LC tank circuit, an inductor and a capacitor may be provided outside the power supply circuit 100.

FIG. 7 shows voltage waveform examples of adiabatic circuit operation of the embodiment. Hereinafter, the description will be made on an example in which VR1=¾·VDD; VR2=¼·VDD; VP and VM are sine waves; and the adiabatic logic circuit 200 is the two-stage inverter as described with reference to FIG. 5, for simplifying the description.

As shown by H1 in FIG. 7, a sine wave having an amplitude of ¼·VDD with ¾·VDD as a reference (center voltage) is supplied as the power supply voltage VP. As shown by H2, a sine wave having an amplitude of ¼·VDD with ¼·VDD as a reference is supplied as the power supply voltage VM. The sine waves of the power supply voltages VP and VM are different in phase by 180°. When the low level voltage (VSS) is input as the input voltage VIN as shown by H3, the power supply voltage VP is output as the output voltage VQ1 of the preceding inverter as shown by H4, and the power supply voltage VM is output as the output voltage VQ2 of the subsequent inverter as shown by H5. On the other hand, when the high level voltage (VDD) is input as the input voltage VIN as shown by H6, the power supply voltage VM is output as the output voltage VQ1 as shown by H7, and the power supply voltage VP is output as the output voltage VQ2 as shown by H8.

Here, in the first comparative example of FIGS. 1A and 1B, the adiabatic logic circuit has the problem that a diode for holding an output voltage of the logic circuit is required. Moreover, as described above in the second comparative example, there is the task of reducing the power consumption of the power supply circuit.

In view of this, according to the embodiment, the power supply circuit 100 supplies the first power supply voltage VP and the second power supply voltage VM, and the adiabatic logic circuit 200 performs adiabatic circuit operation with the supply of the first power supply voltage VP and the second power supply voltage VM. The first power supply voltage VP supplied by the power supply circuit 100 periodically changes with the first reference voltage VR1 as a reference voltage, while the second power supply voltage VM supplied by the power supply circuit 100 periodically changes with the second reference voltage VR2 as a reference voltage. Then, the power supply circuit 100 supplies, due to resonance, the first power supply voltage VP and the second power supply voltage VM that repeat a first period during which the voltage difference between the first power supply voltage VP and the second power supply voltage VM is decreasing (becomes small) and a second period during which the voltage difference is increasing (becomes large).

As described above with reference to FIG. 7 for example, the power supply voltages VP and VM supplied by the power supply circuit 100 are sine waves with the reference voltages VR1 and VR2 as reference voltages. As shown in FIG. 7, the power supply voltages VP and VM periodically repeat the first period T1 during which the voltage difference is decreasing and the second period T2 during which the voltage difference is increasing. The period T1 is, for example, a period during which the difference voltage between the power supply voltages VP and VM changes from a maximum value (for example, VDD) to a minimum value (for example, 0V). The period T2 is, for example, a period during which the difference voltage between the power supply voltages VP and VM changes from a minimum value (for example, 0V) to a maximum value (for example, VDD).

According to the embodiment, the power supply voltages VP and VM that repeat the first period during which the voltage difference is decreasing and the second period during which the voltage difference is increasing are supplied, so that the adiabatic circuit operation of the adiabatic logic circuit can be realized. Further, the power supply voltages VP and VM are supplied due to resonance, so that electric power regeneration by the power supply circuit can be performed. Still further, the power supply voltages VP and VM have the different reference voltages VR1 and VR2 as references, so that a diode (active element) of the power supply node of the adiabatic logic circuit can be omitted. That is, since the power supply voltage with the reference voltage VR1 or VR2 as a reference is output to the output node of the logic circuit, the output logic level can be fixed even without a diode.

More specifically, the power supply voltage VM becomes a local maximum value during a period between a first local maximum value and a second local maximum value subsequent to the first local maximum value of the power supply voltage VP and becomes a local minimum value during a period between a first local minimum value and a second local minimum value subsequent to the first local minimum value of the power supply voltage VP. As shown in FIG. 7 for example, VM becomes a local maximum value ½·VDD during a period T3 between the first local maximum value VDD and the second local maximum value VDD of VP. VM becomes a local minimum value VSS during a period T4 between the first local minimum value ½·VDD and the second local minimum value ½·VDD of VP.

By doing this, the power supply voltages VP and VM that repeat the first period during which the voltage difference is decreasing and the second period during which the voltage difference is increasing can be supplied. This can realize the adiabatic circuit operation of the adiabatic logic circuit.

In the embodiment, the adiabatic logic circuit 200 includes the inverter. The first power supply voltage VP is supplied to the source electrode of the first conductivity type transistor of the inverter not via another active element. The second power supply voltage VM is supplied to the source electrode of the second conductivity type transistor of the inverter not via another active element.

By doing this, an adiabatic logic circuit in which a diode of a power supply node is omitted can be configured. Moreover, a typical logic circuit (for example, a CMOS logic circuit) can be diverted as it is to an adiabatic logic circuit. That is, in a logic circuit such as an inverter, an adiabatic logic circuit can be realized by replacing typical DC power supply voltages (for example, VDD and VSS) with the power supply voltages VP and VM.

In the embodiment, the first power supply voltage VP and the second power supply voltage VM are sine waves opposite in phase from each other.

By doing this, the power supply voltages VP and VM that repeat the first period during which the voltage difference is decreasing and the second period during which the voltage difference is increasing can be supplied to the adiabatic logic circuit. Moreover, since sine waves can be easily generated by a later-described LC tank circuit or the like, it becomes easy to supply the power supply voltages VP and VM due to resonance.

In the embodiment, an input signal having an edge during the second period (for example, T2 shown in FIG. 7) is input to the adiabatic logic circuit 200.

By doing this, since an edge is not input during the recovery period of charge (for example, T1 shown in FIG. 7), electric power loss can be reduced.

More specifically, an input signal having an edge at a timing in which the voltage difference between the first power supply voltage VP and the second power supply voltage VM is minimized is input to the adiabatic logic circuit 200.

By doing this, since an output voltage does not suddenly change when the logic level of an input signal changes, the adiabatic circuit operation of the adiabatic logic circuit can be realized. As described above with reference to FIG. 7 for example, the power supply voltage VP is a sine wave in a voltage range from VDD to VDD/2. The power supply voltage VM is in a voltage range from VDD/2 to VSS and is a sine wave opposite in phase with the power supply voltage VP. At the timing in which the voltage difference between the power supply voltages VP and VM is minimized (VP=VM=VDD/2) as shown by H9 in FIG. 7, the input voltage VIN changes as shown by H10. Therefore, the voltage of the output node NQ1 changes smoothly as shown by H11, and the inverter can operate adiabatically.

In the embodiment, an input signal having an edge during a period in which the minimum voltage difference between the power supply voltages VP and VM is smaller than a predetermined voltage (for example, VR1−VR2) may be input to the adiabatic logic circuit 200.

Also in the embodiment, the minimum voltage difference between the first power supply voltage VP and the second power supply voltage VM may be smaller than a threshold voltage of the first conductivity type transistor and a threshold voltage of the second conductivity type transistor.

By doing this, a shoot-through current that flows when an input signal changes can be prevented in the adiabatic logic circuit. This will be specifically described with reference to FIG. 8. Hereinafter, as shown in FIG. 5 described above, the description will be made on an example in which the first conductivity type transistor is the PMOS transistor PM1, and the second conductivity type transistor is the NMOS transistor NM1. For simplifying the description, the threshold voltages of the transistors PM1 and NM1 are the same in the example.

Figure 8:
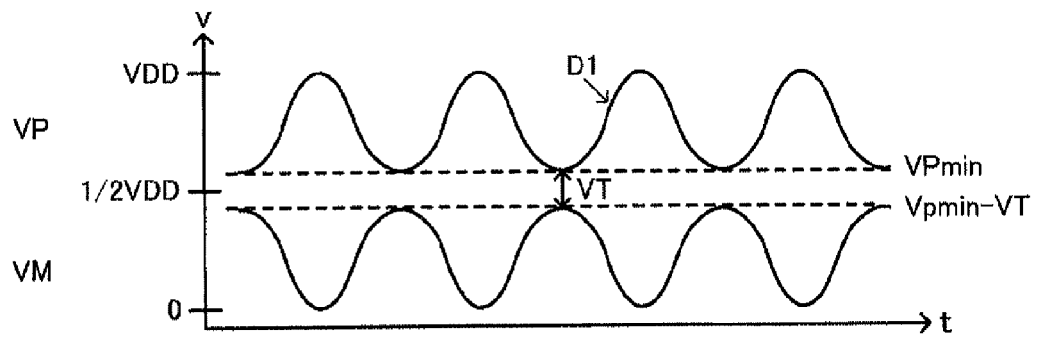
FIG. 8 explains the voltage ranges of first and second power supply voltages.
Figure 8:
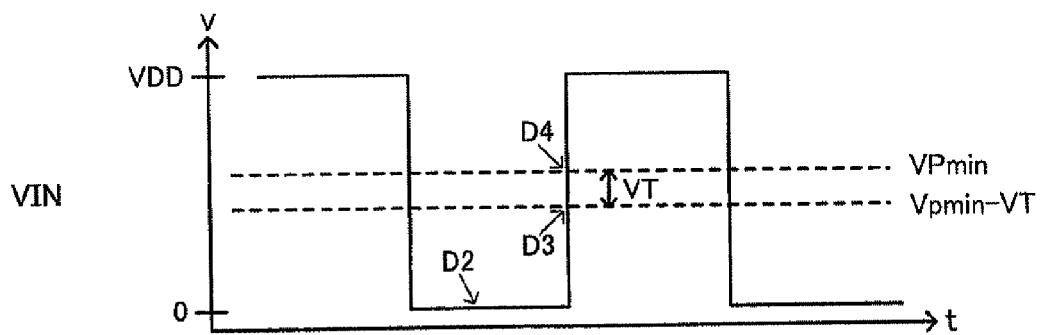

As shown by D1 in FIG. 8, it is assumed that the power supply voltage VP having a lower limit voltage of VPmin and the power supply voltage VM having an upper limit voltage of VPmin−VT are supplied. In this case, the voltage VT is assumed as being the threshold voltages of the transistors PM1 and NM1. As shown by D2, when the input voltage VIN of the transistor equals VSS, the transistor PM1 is turned on, and the transistor NM1 is turned off. As shown by D3, since VP=VPmin when VIN=VPmin−VT, the voltage between the gate and source of the transistor PM1 becomes VT, so that the transistor PM1 is turned off. As shown by D4, since VM=VPmin−VT when. VIN=VPmin, the voltage between the gate and source of the transistor NM1 becomes VT, so that the transistor NM1 is turned on. In this manner, since at least one of the transistors PM1 and NM1 is turned off when the input voltage VIN changes, a shoot-through current does not flow.

In the embodiment, the forward voltage of a diode junction in the adiabatic logic circuit 200 is Vf, and the minimum voltage difference between the first power supply voltage VP and the second power supply voltage VM may be set greater than −Vf when the reference voltage VR1 of the first power supply voltage VP is greater than the reference voltage VR2 of the second power supply voltage VM.

By doing this, even when a parasitic diode junction is produced between the power supply voltages VP and VM depending on the connection conditions of the transistors, a forward current is prevented from flowing to the diode junction. This makes it possible to prevent latch-up or an increase in consumption current caused by the flowing of the forward current to the parasitic diode junction. This will be specifically described with reference to FIGS. 9 and 10.

Figure 9:
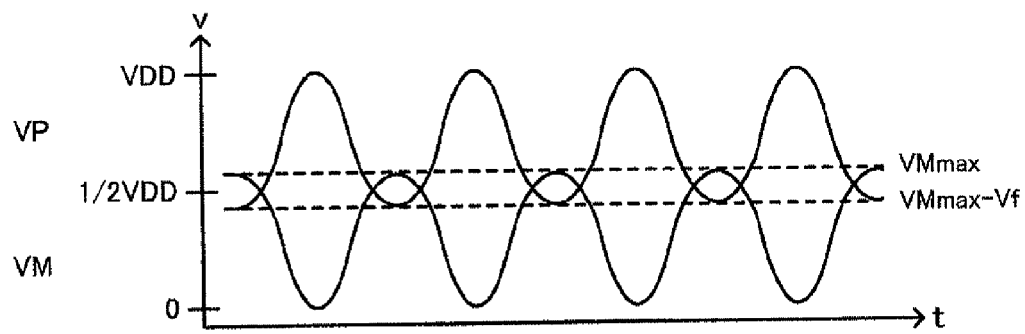
FIG. 9 explains the voltage ranges of the first and second power supply voltages.
Figure 10:
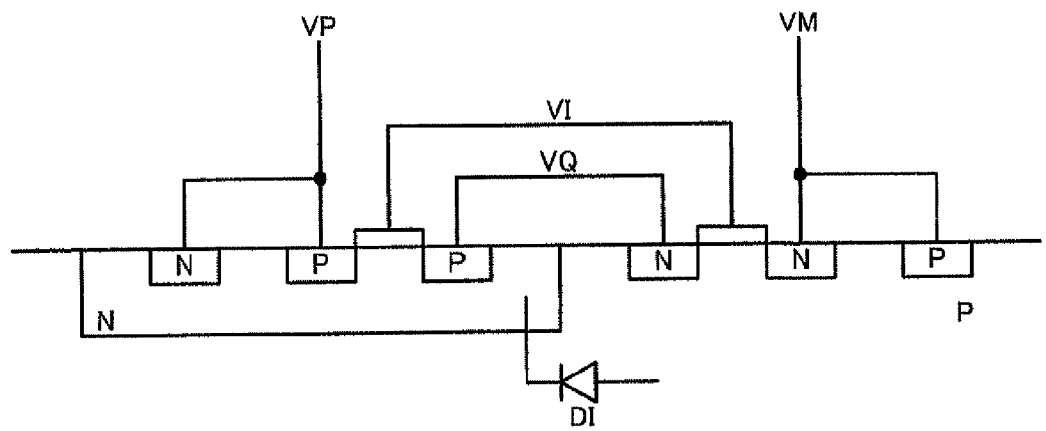
FIG. 10 explains the voltage ranges of the first and second power supply voltages.

As shown in FIG. 9, it is assumed that the power supply voltages VP and VM in the relation of VP−VM>−Vf are supplied. As shown in FIG. 10, it is also assumed that NMOS transistors are formed in a P substrate and the power supply voltage VM is supplied to the P substrate and a source electrode of the NMOS transistor, and that PMOS transistors are formed in an N well and the power supply voltage VP is supplied to the N well and a source electrode of the PMOS transistor. Then, a parasitic diode junction D1 is produced between the power supply voltages VP and VM. When the forward voltage of the diode junction D1 is defined as Vf, a forward current can be prevented from flowing between the power supply voltages VP and VM by setting the forward voltage to satisfy the relation of VP−VM>−Vf as described above.

4. SINGLE TANK CIRCUIT

As described above with reference to FIG. 6A, the power supply voltages VP and VM can be supplied due to resonance of one tank circuit in the embodiment. FIGS. 11 to 15 show detailed configuration examples of such a single tank circuit. Hereinafter, the description will be made on an example in which the reference voltage VR1=¾·VDD, and the reference voltage VR2=¼·VDD.

Figure 11:
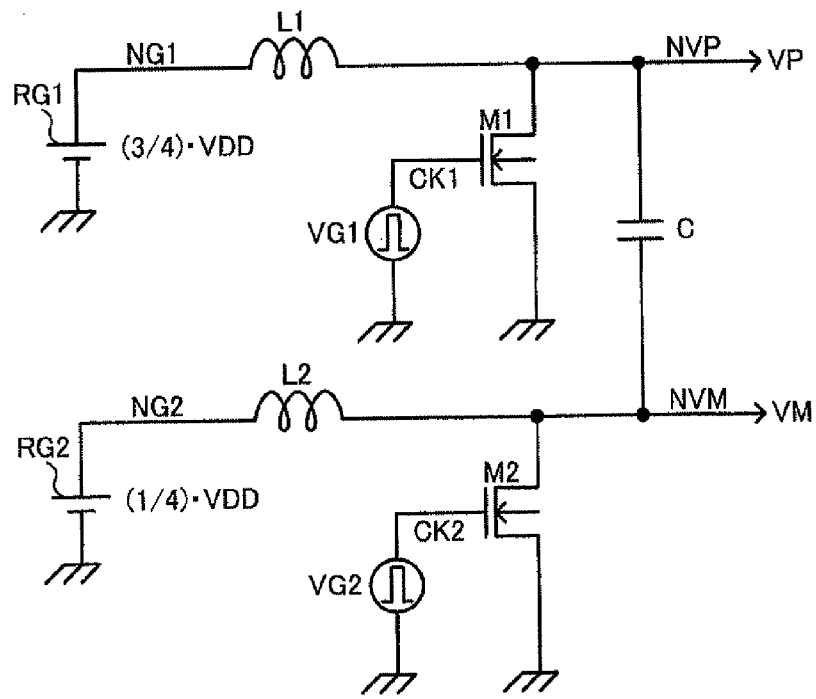
FIG. 11 shows a first detailed configuration example of a single tank circuit.

FIG. 11 shows a first detailed configuration example of the single tank circuit. The configuration example includes a first reference voltage supply node NG1, a second reference voltage supply node NG2, a first inductor L1, a second inductor L2, a capacitor C, a first exciting transistor M1, a second exciting transistor M2, a first excitation clock generating circuit VG1, and a second excitation clock generating circuit VG2. The tank circuit of the embodiment is not limited to this configuration, and various modifications such as omitting some of the constituents (for example, the clock generating circuits VG1 and VG2) or adding another constituent can be implemented.

The inductor L1 is disposed between the first reference voltage supply node NG1 and a first output node NVP. The inductor L2 (for example, L2=L1) is disposed between the second reference voltage supply node NG2 and a second output node NVM. The capacitor C is disposed between the output nodes NVP and NVM. A drain terminal (source terminal; one end of M1 in the broad sense) of the exciting transistor M1 is connected to the output node NVP. A ground voltage (VSS; second DC power supply voltage in the broad sense) is supplied to a source terminal (drain terminal) of M1, and a first excitation clock CK1 from the excitation clock generating circuit VG1 is input to a gate terminal thereof. A drain terminal (one end of M2 in the broad sense) of the exciting transistor M2 is connected to the output node NVM. The ground voltage is supplied to a source terminal of M2, and a second excitation clock CK2 from the excitation clock generating circuit VG2 is input to a gate terminal thereof.

For example, the exciting transistors M1 and M2 are each configured with an NMOS transistor. The excitation clock generating circuits VG1 and VG2 are each configured with, for example, a logic circuit and respectively generate the excitation clocks CK1 and CK2 based on the clock CK described above with reference to FIG. 4 and the like. Alternatively, the excitation clock generating circuits VG1 and VG2 are each configured with an oscillation circuit such as a ring oscillator and may respectively generate the excitation clocks CK1 and CK2 with the oscillation circuit. Alternatively, the excitation clock generating circuits VG1 and VG2 may be circuits that feed back tank circuit outputs VP and VM. In this case, the oscillation circuit self-oscillates.

A first reference voltage generating circuit RG1 outputs the reference voltage ¾·VDD to the reference voltage supply node NG1, and a second reference voltage generating circuit RG2 outputs the reference voltage ¼·VDD to the reference voltage supply node NG2. The reference voltage generating circuits RG1 and RG2 represent a function of the reference voltage generating circuit described above with reference to FIG. 6A and the like. The exciting transistors M1 and M2 are turned on and off based on the excitation clocks CK1 and CK2, so that the tank circuit is current-excited. The resonance of the tank circuit is performed by exchanging energy between the inductors L1 and L2 and the capacitor C. Then, the power supply voltage VP with ¾·VDD as a reference and the power supply voltage VM with ¼·VDD as a reference are output.

In this case, the power supply voltages VP and VM drive the load capacitances (for example, gate capacitances of PM2 and NM2 in FIG. 5) of the adiabatic logic circuit. The load capacitances are driven via the on-resistances of the transistors (for example, PM1 and NM1 in FIG. 5) of the adiabatic logic circuit. In the adiabatic circuit operation, since a power supply voltage that changes at a cycle longer than a time constant based on the on-resistance of the transistor and the load capacitance is used, it is considered that a voltage drop caused by the on-resistance of the transistor can be so small that it can be ignored (VP and VM and the applied voltages of the load capacitances are equal). Therefore, it is considered that resonance is performed also including the load capacitance of the adiabatic logic circuit. Due to the resonance, the charge of the load capacitance is regenerated. In this manner, by configuring the power supply circuit with the tank circuit, electric power regeneration can be performed.

Figure 12:
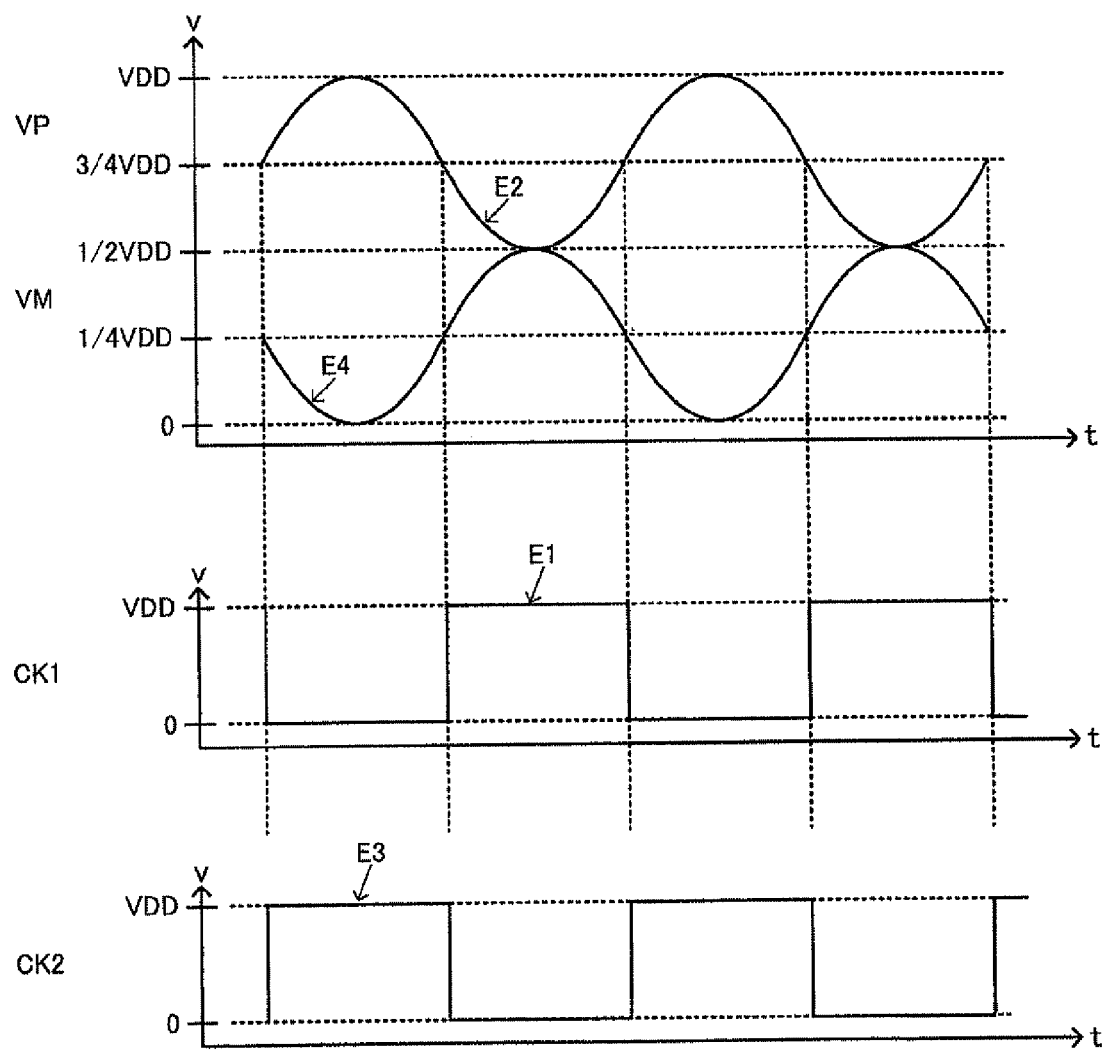
FIG. 12 shows voltage waveform examples of the first detailed configuration example of the single tank circuit.

FIG. 12 shows voltage waveform examples of the first detailed configuration example. As shown by E1 in FIG. 12, a clock whose duties of the high level (VDD) and the low level (VSS) are equal is input as the excitation clock CK1, for example. As shown by E2, during a period in which CK1 is at the high level, the tank circuit outputs the power supply voltage VP in a voltage range equal to or less than the reference voltage $\frac{3}{4}$·VDD. As shown by E3, on the other hand, a clock opposite in phase (different in phase by 180°) with CK1 is input as the excitation clock CK2. As shown by E4, during a period in which CK2 is at the high level, the tank circuit outputs the power supply voltage VM in a voltage range equal to or less than the reference voltage $\frac{1}{4}$·VDD. For example, the frequency of CK1 and CK2 is from 1 MHz to 10 kHz, which is the same (including substantially the same) frequency as the resonant frequency of the tank circuit.

Figure 13:
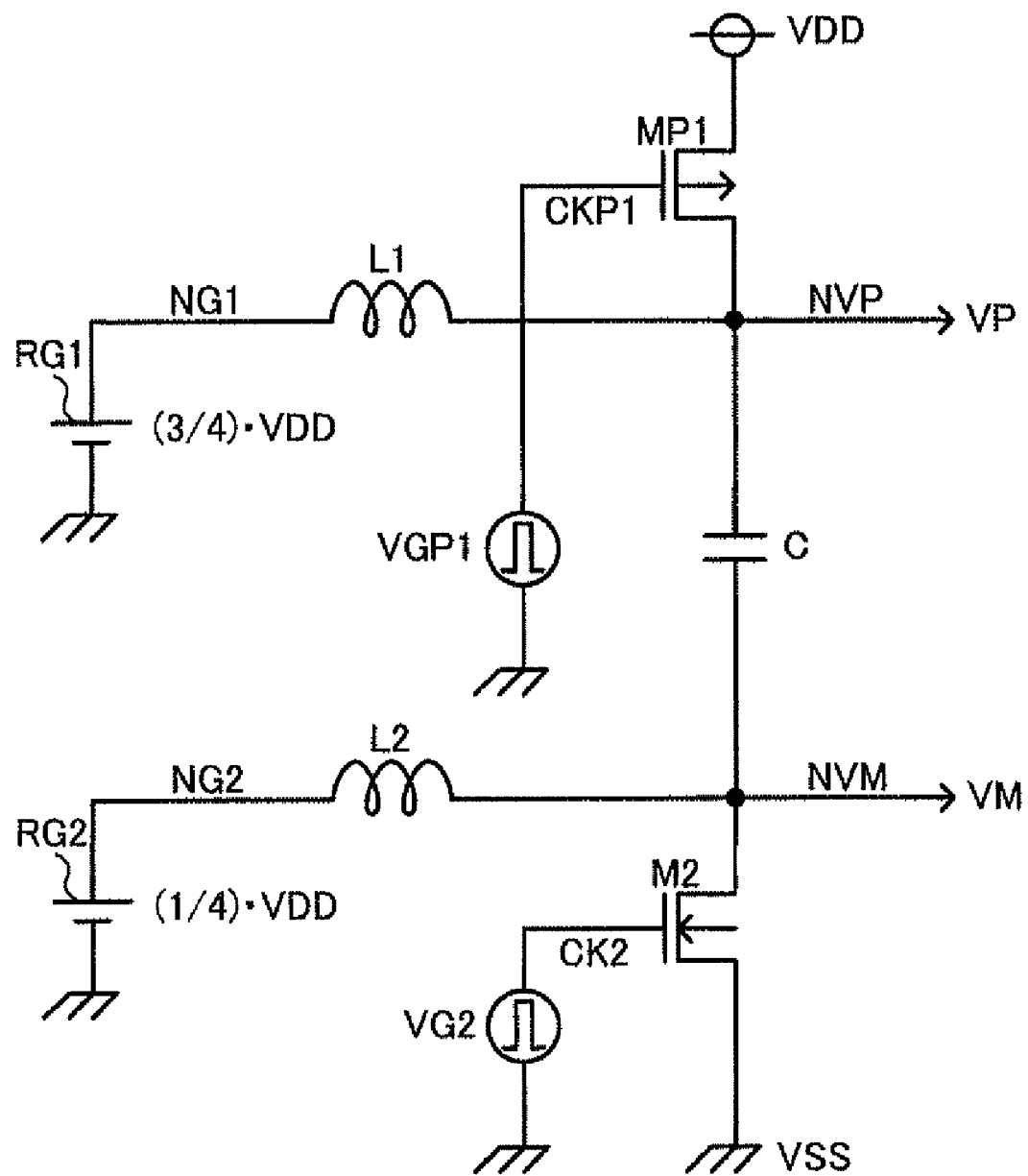
FIG. 13 shows a second detailed configuration example of the single tank circuit.

FIG. 13 shows a second detailed configuration example of the single tank circuit. The configuration example includes the reference voltage supply nodes NG1 and NG2, the inductors L1 and L2, the capacitor C, an exciting transistor MP1, the exciting transistor M2, an excitation clock generating circuit VGP1, and the excitation clock generating circuit VG2. Hereinafter, the same constituents as those described above with reference to FIG. 11 and the like are denoted by the same reference numerals and signs, and the descriptions thereof are omitted as appropriate.

In the second detailed configuration example, the first exciting transistor MP1 is disposed between a DC power supply (VDD) and the output node NVP, different from the first detailed configuration example. That is, a drain electrode of the exciting transistor MP1 is connected to the output node NVP. A DC power supply voltage (VDD; a first DC power supply voltage in the broad sense) is supplied to a source electrode of MP1, and a first excitation clock CKP1 from the first excitation clock generating circuit VGP1 is input to a gate electrode thereof. For example, MP1 is configured with a PMOS transistor. The excitation clock CKP1 can be realized by the same clock as the excitation clock CK2 described above with reference to FIG. 12 and the like.

Figure 14:
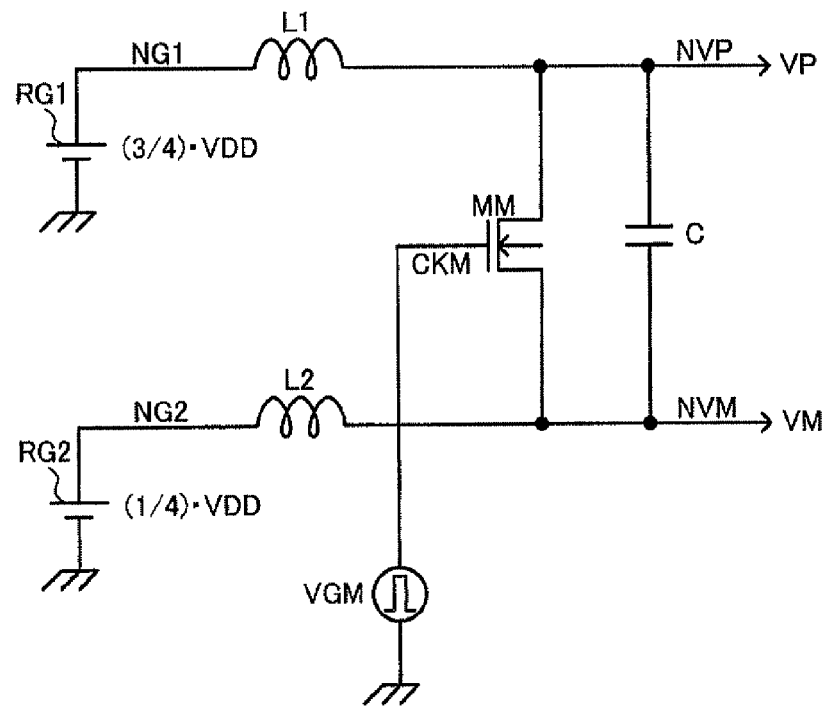
FIG. 14 shows a third detailed configuration example of the single tank circuit.

FIG. 14 shows a third detailed configuration example of the single tank circuit. The configuration example includes the reference voltage supply nodes NG1 and NG2, the inductors L1 and L2, the capacitor C, an exciting transistor MM, and an excitation clock generating circuit VGM.

In the third detailed configuration example, the exciting transistor MM is disposed between the output nodes NVP and NVM, different from the first detailed configuration example. That is, a source electrode (drain electrode) of the exciting transistor MM is connected to the output node NVP, and a drain electrode (source electrode) of MM is connected to the output node NVM. An excitation clock CKM from the excitation clock generating circuit VGM is input to a gate electrode of MM. For example, MM is configured with an NMOS transistor. The excitation clock CKM can be realized by the same clock as the excitation clock CK1 described above with reference to FIG. 12 and the like.

Figure 15:
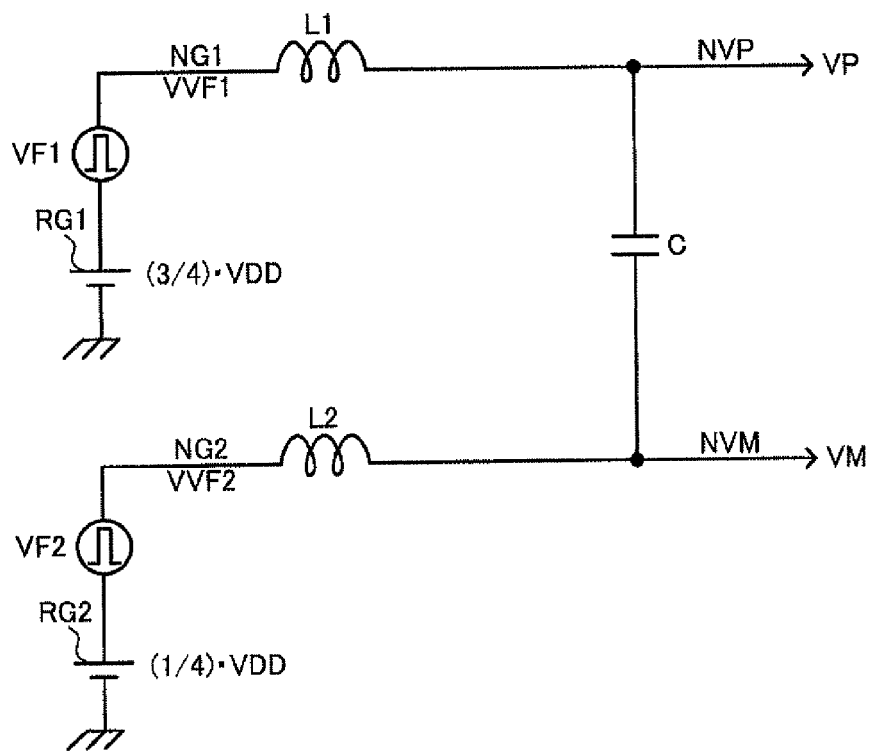
FIG. 15 shows a fourth detailed configuration example of the single tank circuit.

FIG. 15 shows a fourth detailed configuration example of the single tank circuit. The configuration example includes the reference voltage supply nodes NG1 and NG2, the inductors L1 and L2, and the capacitor C.

Voltage from the reference voltage generating circuit RG1 and a first excitation voltage generating circuit VF1 is supplied to the reference voltage supply node NG1. Voltage from the reference voltage generating circuit RG2 and a second excitation voltage generating circuit VF2 is supplied to the reference voltage supply node NG2. The excitation voltage generating circuits VF1 and VF2 can be included in the reference voltage generating circuit.

Figure 16:
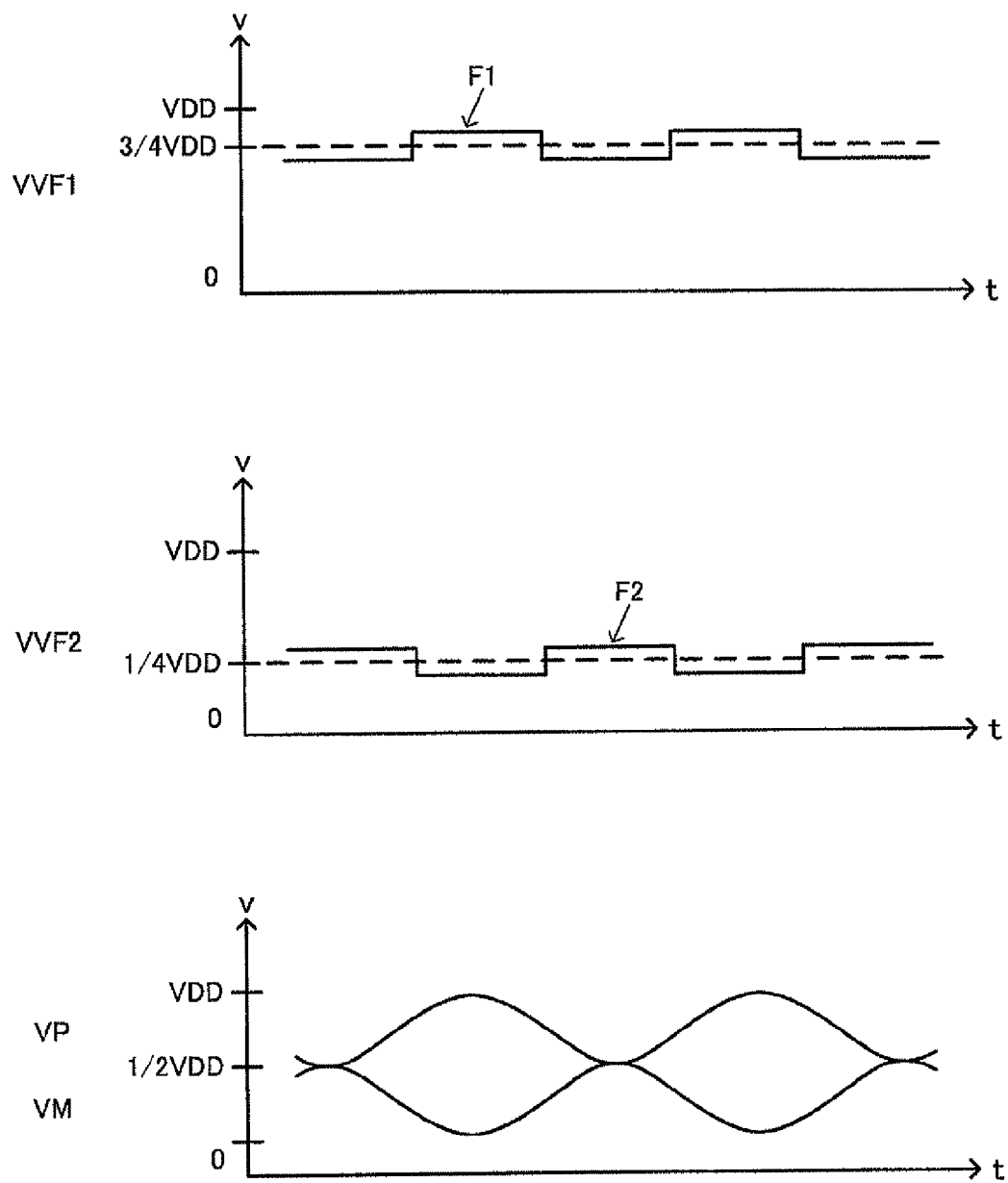
FIG. 16 shows voltage waveform examples of the fourth detailed configuration example of the single tank circuit.

In the fourth detailed configuration example, voltage excitation is performed with the excitation voltage generating circuits VF1 and VF2, different from the first detailed configuration example. That is, the excitation voltage generating circuits VF1 and VF2 respectively apply excitation voltages VVF1 and VVF2 with the reference voltages VR1 and VR2 as references to the inductors L1 and L2, so that the tank circuit is voltage-excited. For example, FIG. 16 shows voltage waveform examples of the fourth detailed configuration example. As shown by F1 in FIG. 16, $\frac{3}{4}$·VDD+VF1 is supplied as the excitation voltage VVF1. Moreover, $\frac{1}{4}$·VDD+VF2 is supplied as the excitation voltage VVF2.

5. DUAL TANK CIRCUIT

As described above with reference to FIG. 6B, the power supply voltages VP and VM can be supplied due to resonances of two tank circuits in the embodiment. FIGS. 17 to 22 show detailed configuration examples of such a dual tank circuit.

Figure 17:
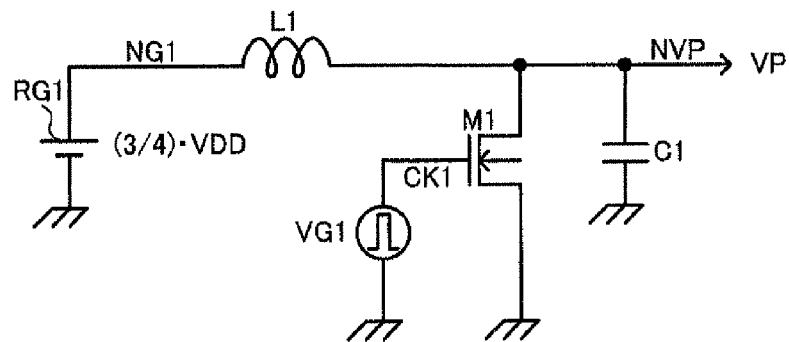
FIG. 17 shows a first detailed configuration example of a dual tank circuit.
Figure 17:
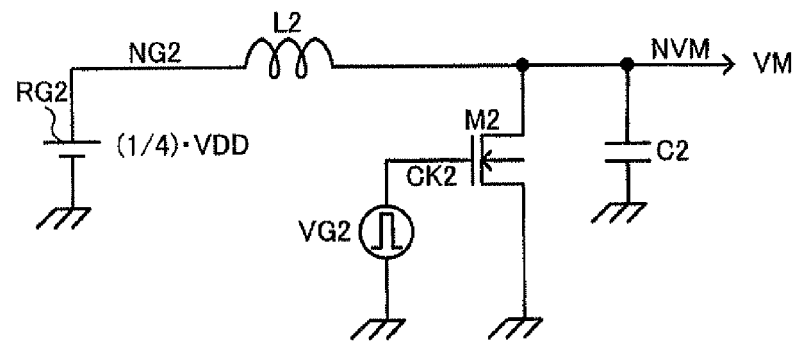

FIG. 17 shows a first detailed configuration example of the dual tank circuit. The configuration example includes the first reference voltage supply node NG1, the second reference voltage supply node NG2, the first inductor L1, the second inductor L2, a first capacitor C1, a second capacitor C2, the first exciting transistor M1, the second exciting transistor M2, the first excitation clock generating circuit VG1, and the second excitation clock generating circuit VG2. The tank circuit of the embodiment is not limited to this configuration, and various modifications such as omitting some of the constituents (for example, the clock generating circuits VG1 and VG2) or adding another constituent can be implemented.

The inductor L1 is disposed between the first reference voltage supply node NG1 and the first output node NVP. The capacitor C1 is disposed between the output node NVP and the ground (ground node; a second DC power supply in the broad sense). The drain terminal of the exciting transistor M1 is connected to the output node NVP. The ground voltage is supplied to the source terminal of M1, and the first excitation clock CK1 from the excitation clock generating circuit VG1 is input to the gate terminal thereof The inductor L2 (for example, L2=L1) is disposed between the second reference voltage supply node NG2 and the second output node NVM. The capacitor C2 (for example, C2=C1) is disposed between the output node NVM and the ground (ground node). The drain terminal of the exciting transistor M2 is connected to the output node NVM. The ground voltage is supplied to the source terminal of M2, and the second excitation clock CK2 from the excitation clock generating circuit VG2 is input to the gate terminal thereof. For example, the exciting transistors M1 and M2 are each configured with an NMOS transistor.

The dual tank circuit of the first detailed configuration example operates with voltage waveforms similar to those of the voltage waveform examples described above with reference to FIG. 12 for example, and outputs the power supply voltages VP and VM due to current excitation. According to such a dual tank circuit, electric power regeneration is possible due to LC resonance in the same manner as the above-described single tank circuit.

Figure 18:
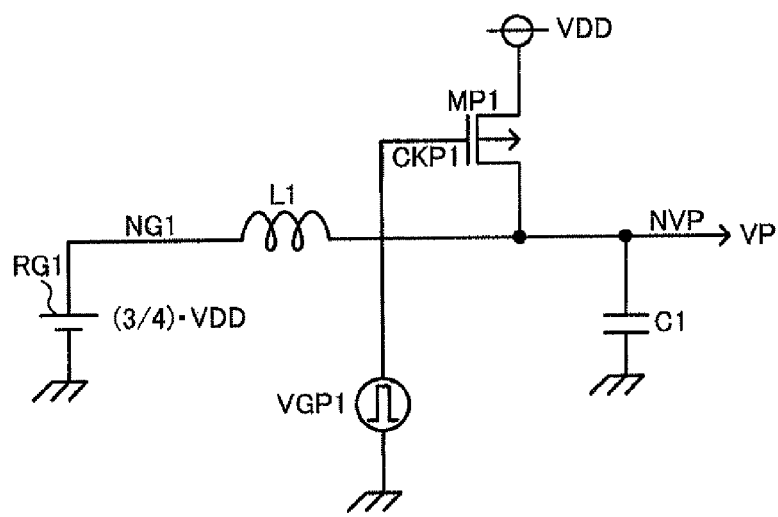
FIG. 18 shows a second detailed configuration example of the dual tank circuit.

FIG. 18 shows a second detailed configuration example of the dual tank circuit. The configuration example includes the reference voltage supply nodes NG1 and NG2, the inductors L1 and L2, the capacitors C1 and C2, the exciting transistors MP1 and M2, and the excitation clock generating circuits VGP1 and VG2. In the second detailed configuration example, since the reference voltage supply node NG2, the inductor L2, the capacitor C2, the exciting transistor M2, and the excitation clock generating circuit VG2 are configured in the same manner as the above-described first detailed configuration example, the illustrations thereof are omitted. Hereinafter, the same constituents as those described above with reference to FIG. 17 and the like are denoted by the same reference numerals and signs, and the descriptions thereof are omitted as appropriate.

In the second detailed configuration example, the first exciting transistor MP1 is disposed between the DC power supply (VDD) and the output node NVP, different from the first detailed configuration example. That is, the drain electrode of the exciting transistor MP1 is connected to the output node NVP. The DC power supply voltage VDD is supplied to the source electrode of MP1, and the first excitation clock CKP1 from the first excitation clock generating circuit VGP1 is input to the gate electrode thereof. For example, MP1 is configured with a PMOS transistor. The excitation clock CKP1 can be realized by the same clock as the excitation clock CK2 described above with reference to FIG. 12 and the like.

Figure 19:
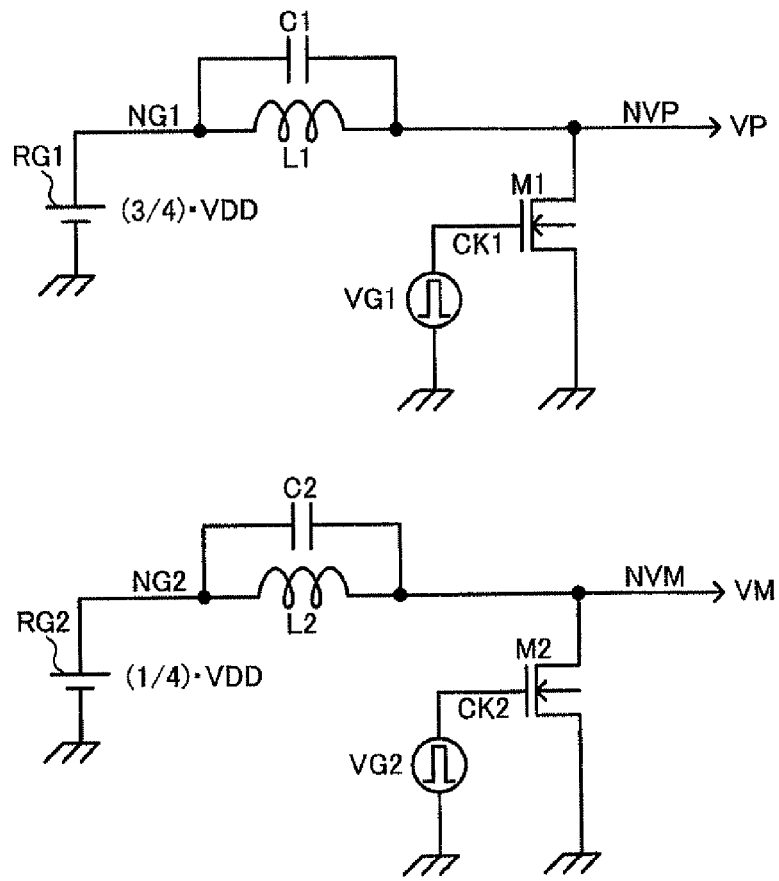
FIG. 19 shows a third detailed configuration example of the dual tank circuit.

FIG. 19 shows a third detailed configuration example of the dual tank circuit. The configuration example includes the reference voltage supply nodes NG1 and NG2, the inductors L1 and L2, the capacitors C1 and C2, the exciting transistors M1 and M2, and the excitation clock generating circuits VG1 and VG2.

In the third detailed configuration example, the capacitors C1 and C2 are respectively disposed between the output node NVP and the reference voltage supply node NG1 and between the output node NVM and the reference voltage supply node NG2, different from the first detailed configuration example. The dual tank circuit of the third detailed configuration example operates with the same voltage waveforms as the voltage waveforms described above with reference to FIG. 12 and the like for example, and outputs the power supply voltages VP and VM due to current excitation.

Figure 20:
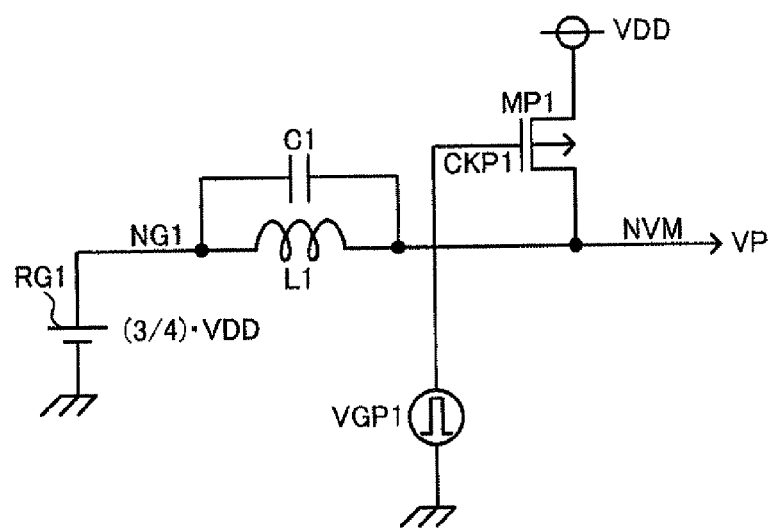
FIG. 20 shows a fourth detailed configuration example of the dual tank circuit.

FIG. 20 shows a fourth detailed configuration example of the dual tank circuit. The configuration example includes the reference voltage supply nodes NG1 and NG2, the inductors L1 and L2, the capacitors C1 and C2, the exciting transistors MP1 and M2, and the excitation clock generating circuits VGP1 and VG2. In the fourth detailed configuration example, since the reference voltage supply node NG2, the inductor L2, the capacitor C2, the exciting transistor M2, and the excitation clock generating circuit VG2 are configured in the same manner as the above-described third detailed configuration example, the illustrations thereof are omitted.

In the fourth detailed configuration example, the first exciting transistor MP1 is disposed between the DC power supply (VDD) and the output node NVP, different from the third detailed configuration example. MP1 is on and off controlled with the excitation clock CKP1, so that the tank circuit is current-excited. The excitation clock CKP1 can be realized by the same clock as the excitation clock CK2 described above with reference to FIG. 12 and the like.

Figure 21:
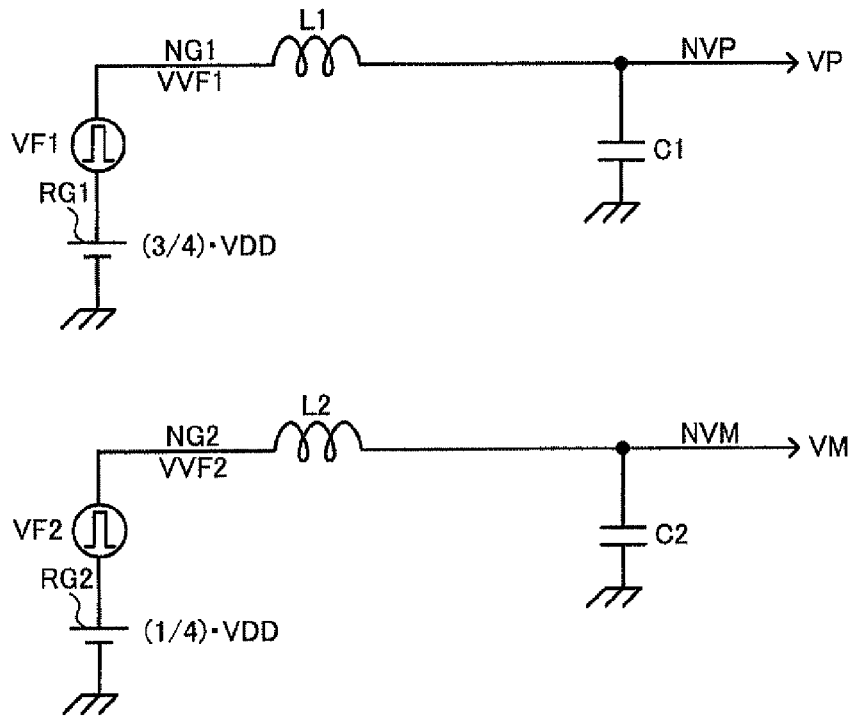
FIG. 21 shows a fifth detailed configuration example of the dual tank circuit.

FIG. 21 shows a fifth detailed configuration example of the dual tank circuit. The configuration example includes the reference voltage supply nodes NG1 and NG2, the inductors L1 and L2, and the capacitors C1 and C2.

Voltage from the reference voltage generating circuit RG1 and the first excitation voltage generating circuit VF1 is supplied to the reference voltage supply node NG1. Voltage from the reference voltage generating circuit RG2 and the second excitation voltage generating circuit VF2 is supplied to the reference voltage supply node NG2. The excitation voltage generating circuits VF1 and VF2 can be included in the reference voltage generating circuit.

In the fifth detailed configuration example, voltage excitation is performed with the excitation voltage generating circuits VF1 and VF2 in the same manner as the fourth detailed configuration example of the single tank circuit described above with reference to FIG. 15. That is, the excitation voltage generating circuits VF1 and VF2 respectively output the excitation voltages VVF1 and VVF2, and the tank circuit is voltage-excited. Therefore, the power supply voltages VP and VM are generated.

Figure 22:
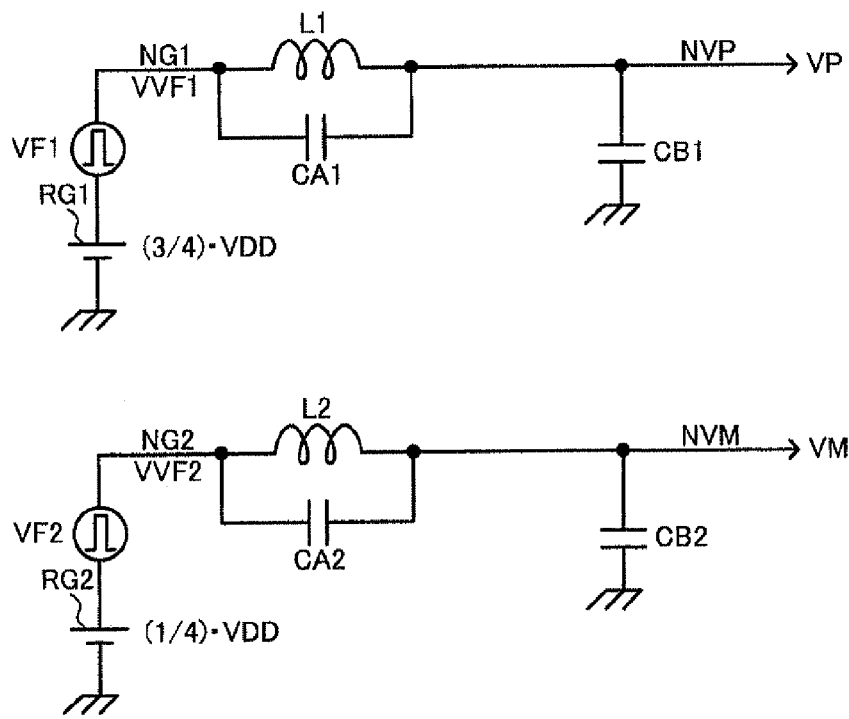
FIG. 22 shows a sixth detailed configuration example of the dual tank circuit.

FIG. 22 shows a sixth detailed configuration example of the dual tank circuit. The configuration example includes the NG1 and NG2, the inductors L1 and L2, and the capacitors CA1 and CA2 and capacitors CB1 and CB2.

Like the fifth configuration example, the voltage from the reference voltage generating circuit RG1 and the first excitation voltage generating circuit VF1 is supplied to the reference voltage supply node NG1, and the voltage from the reference voltage generating circuit RG2 and the second excitation voltage generating circuit VF2 is supplied to the reference voltage supply node NG2. The excitation voltage generating circuits VF1 and VF2 can be included in the reference voltage generating circuit.

In the sixth detailed configuration example, the capacitors CA1 and CA2 are respectively disposed between the reference voltage supply node NG1 and the output node NVP and between the reference voltage supply node NG2 and the output node NVM, different from the fifth detailed configuration example. The capacitors CB1 and CB2 are respectively disposed between the ground (VSS) and the output nodes NVP and NVM. Then, resonance is performed between the inductor L1 and the capacitors CA1 and CB1, and resonance is performed between the inductor L2 and the capacitors CA2 and CB2.

6. COUPLED DUAL TANK CIRCUIT

In the embodiment, a tank circuit in which the power supply voltages of the above-described dual tank circuit are coupled with a capacitor can also be used. With reference to FIGS. 23 to 27, 31, and 32, a coupled dual tank circuit will be described in detail.

Figure 23:
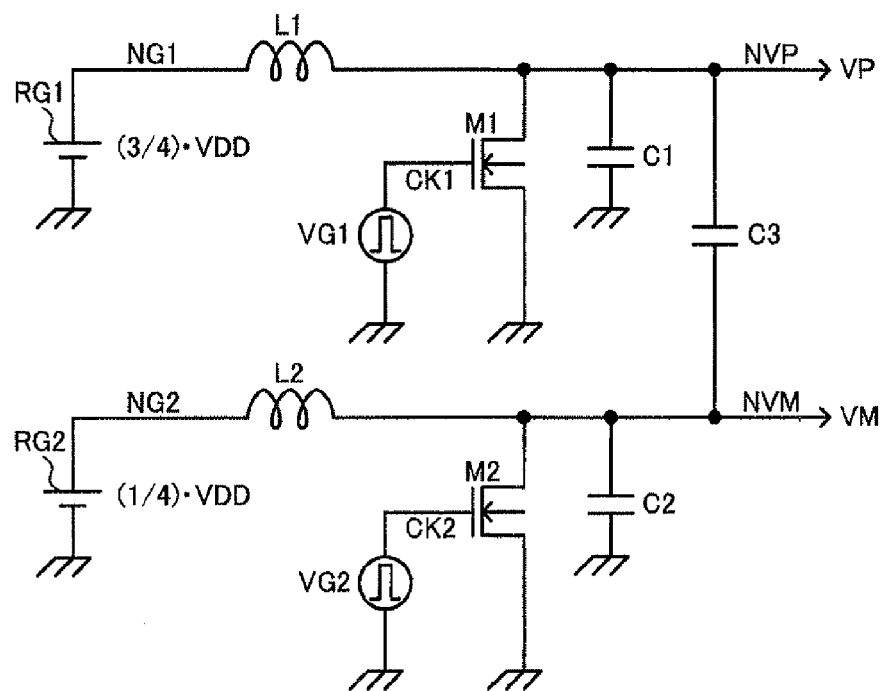
FIG. 23 shows a first detailed configuration example of a coupled dual tank circuit.

FIG. 23 shows a first detailed configuration example of the coupled dual tank circuit. The configuration example includes the reference voltage supply nodes NG1 and NG2, the inductors L1 and L2, the first and second capacitors C1 and C2 and a third capacitor C3, the exciting transistors M1 and M2, and the excitation clock generating circuits VG1 and VG2.

In the first detailed configuration example, a tank circuit similar to the above-described first detailed configuration example of the dual tank circuit is configured with the inductors L1 and L2 and the capacitors C1 and C2, the reference voltage supply nodes NG1 and NG2, the exciting transistors M1 and M2, and the excitation clock generating circuits VG1 and VG2. The capacitor C3 (for example, C3=C1/2=C2/2) is disposed between the output nodes NVP and NVM. In the first detailed configuration example, current excitation is performed with the exciting transistors M1 and M2, and the power supply voltages VP and VM are generated due to resonance between the inductors L1 and L2 and the capacitors C1 to C3.

Figure 24:
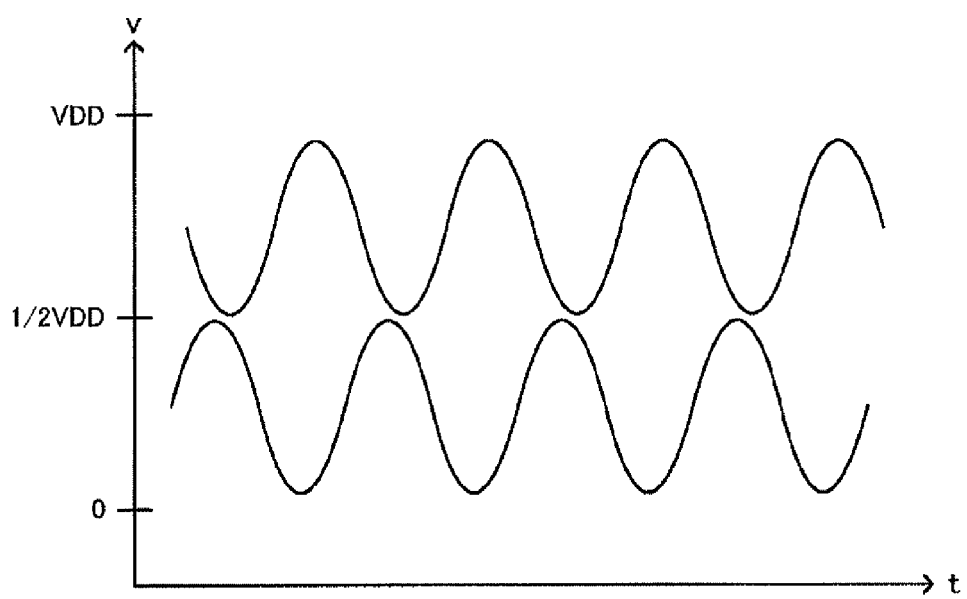
FIG. 24 explains voltage waveform examples of a dual tank circuit and a coupled dual tank circuit.

According to such a coupled dual tank circuit, power supply voltages necessary for adiabatic circuit operation can be output with high accuracy. This will be described with reference to FIGS. 24 and 25. FIG. 24 schematically shows voltage waveform examples when variations due to manufacturing variations or the like occur between inductances of the inductors L1 and L2 in the above-described dual tank circuit.

As shown in FIG. 24, the power supply voltages VP and VM become power supply voltages having frequencies equal to each other according to the frequency of an excitation clock. However, when there are variations between L1 and L2 (for example, about 3%), resonant frequencies of the tank circuits that generate the power supply voltages VP and VM are different from each other. Therefore, a timing in which the power supply voltage VP is a minimum voltage (valley) and a timing in which the power supply voltage VM is a maximum voltage (peak) are shifted in time. Then, voltage gap occurs between the power supply voltages VP and VM when the input voltage of the adiabatic logic circuit changes, which may generate a period during which adiabatic circuit operation (for example, FIG. 7 described above) is not achieved.

Figure 25:
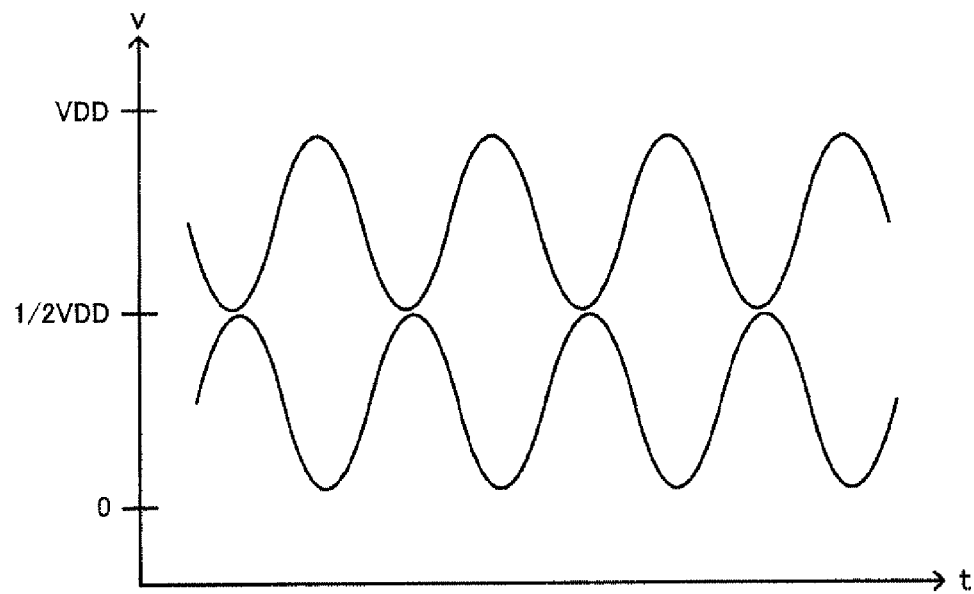
FIG. 25 explains voltage waveform examples of the dual tank circuit and the coupled dual tank circuit.

As shown in FIG. 25, on the other hand, the timings of the valley and peak can be brought closer to each other in the coupled dual tank circuit. That is, when the variations between the inductors L1 and L2 are equal to the variations in the dual tank circuit, it is possible to supply the power supply voltages VP and VM that are more nearly opposite phase than in the case of the dual tank circuit, by coupling with the capacitor C3.

Figure 26:
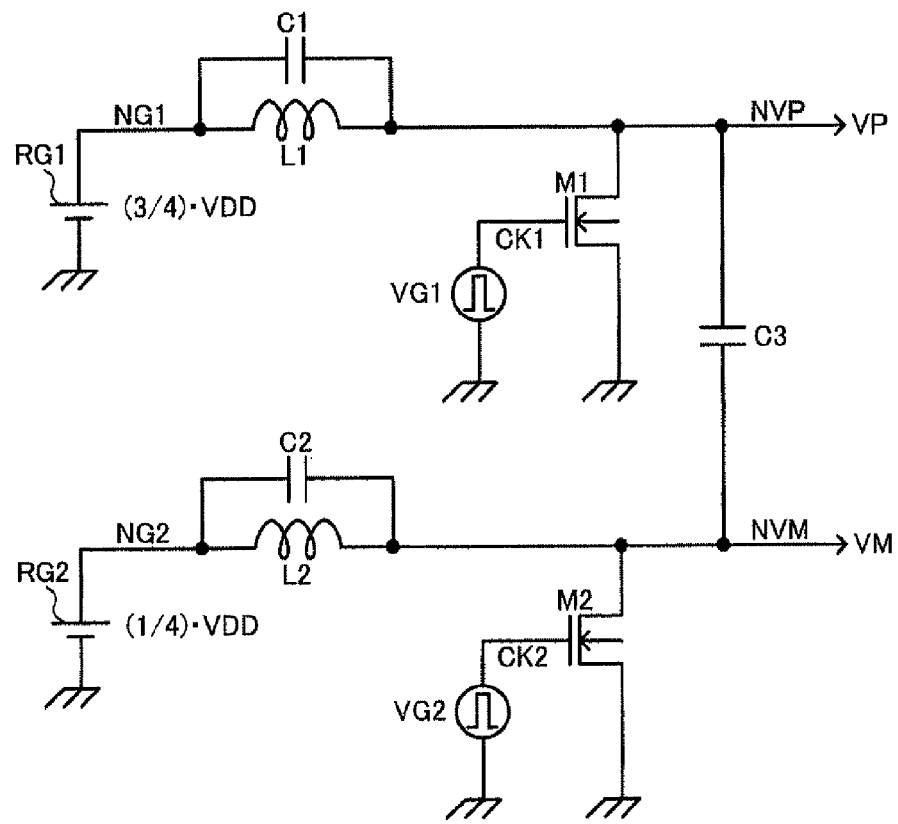
FIG. 26 shows a second detailed configuration example of the coupled dual tank circuit.

FIG. 26 shows a second detailed configuration example of the coupled dual tank circuit. The configuration example includes the reference voltage supply nodes NG1 and NG2, the inductors L1 and L2, the capacitors C1 to C3, the exciting transistors M1 and M2, and the excitation clock generating circuits VG1 and VG2.

In the second detailed configuration example, the capacitors C1 and C2 are respectively disposed between the output node NVP and the reference voltage supply node NG1 and between the output node NVM and the reference voltage supply node NG2, different from the first detailed configuration example. Then, current excitation is performed with the exciting transistors M1 and M2.

Figure 27:
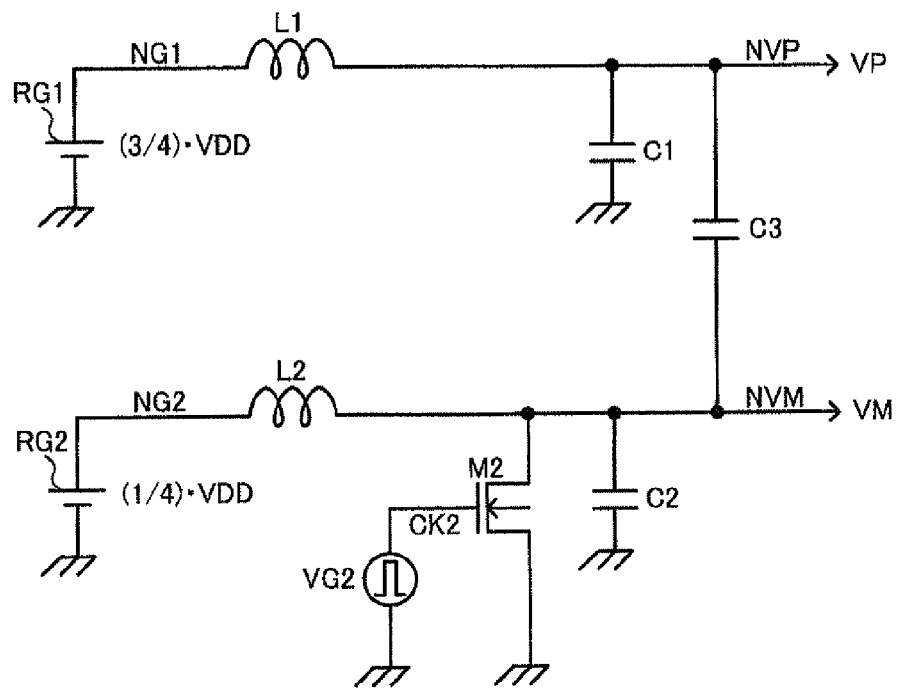
FIG. 27 shows a third detailed configuration example of the coupled dual tank circuit.

FIG. 27 shows a third detailed configuration example of the coupled dual tank circuit. The configuration example includes the reference voltage supply nodes NG1 and NG2, the inductors L1 and L2, the capacitors C1 to C3, the exciting transistor M2, and the excitation clock generating circuit VG2.

In the third detailed configuration example, the exciting transistor M1 described above is not disposed, and current excitation is performed only with the exciting transistor M2. Then, the output nodes NVP and NVM are coupled with the capacitor C3, so that the entire tank circuit is excited.

Figure 31:
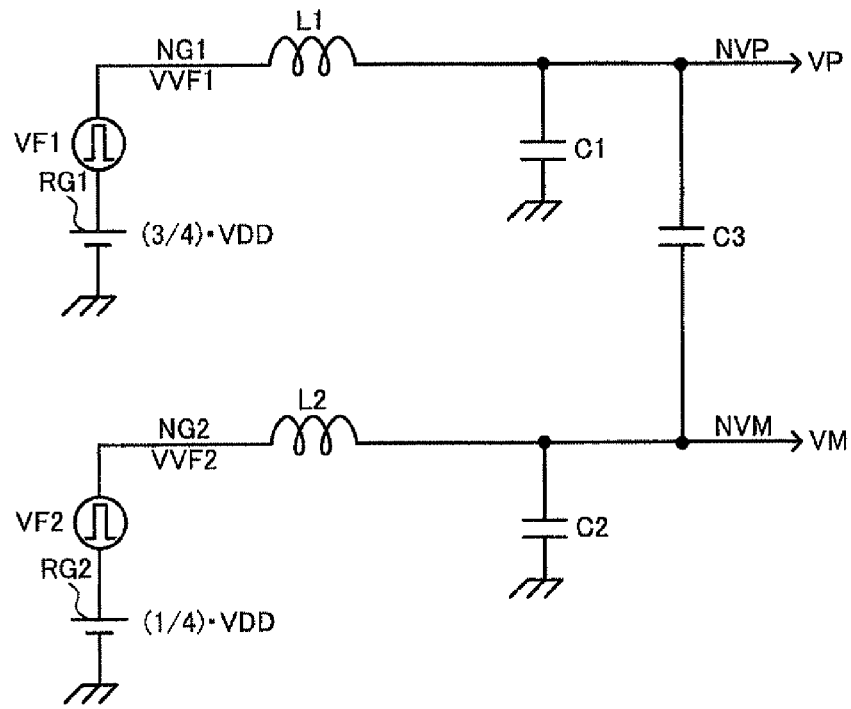
FIG. 31 shows a fourth detailed configuration example of the coupled dual tank circuit.

FIG. 31 shows a fourth detailed configuration example of the coupled dual tank circuit. The configuration example includes the reference voltage supply nodes NG1 and NG2, the inductors L1 and L2, and the capacitors C1 to C3.

Voltage from the reference voltage generating circuit RG1 and the first excitation voltage generating circuit VF1 is supplied to the reference voltage supply node NG1, and voltage from the reference voltage generating circuit RG2 and the second excitation voltage generating circuit VF2 is supplied to the reference voltage supply node NG2. The excitation voltage generating circuits VF1 and VF2 can be included in the reference voltage generating circuit.

In the fourth detailed configuration example, voltage excitation is performed with the excitation voltage generating circuits VF1 and VF2. Specifically, similarly to the voltage excitation of the single tank circuit described above with reference to FIG. 15 and the like, the excitation voltage generating circuits VF1 and VF2 respectively output the excitation voltages VVF1 and VVF2 with the reference voltages ¾·VDD and ¼·VDD as references, so that the tank circuit is voltage-excited.

Figure 32:
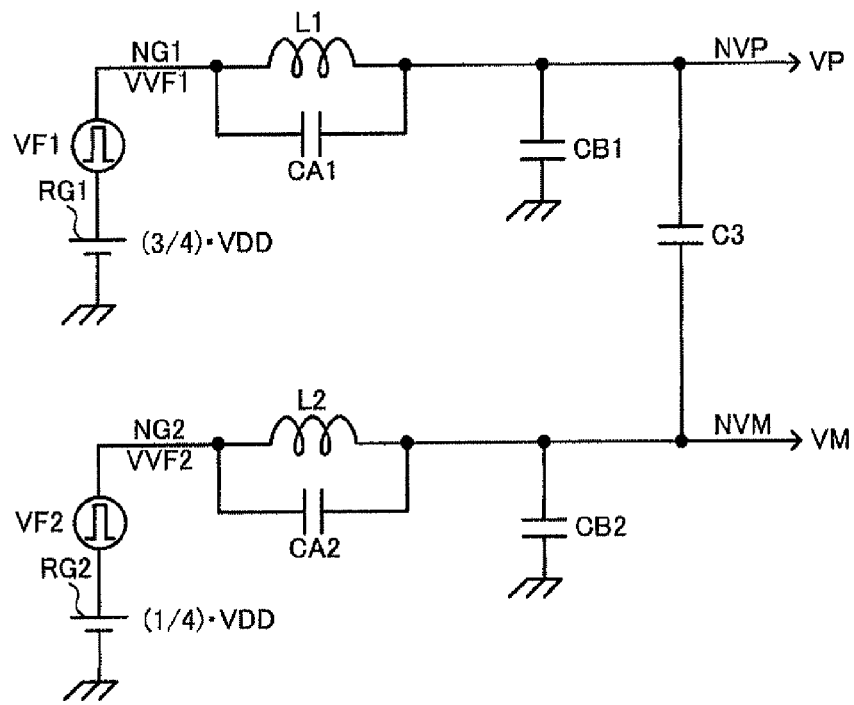
FIG. 32 shows a fifth detailed configuration example of the coupled dual tank circuit.

FIG. 32 shows a fifth detailed configuration example of the coupled dual tank circuit. The configuration example includes the reference voltage supply nodes NG1 and NG2, the inductors L1 and L2, the capacitors CA1, CA2, CB1, CB2, and C3.

In the fifth detailed configuration example, the capacitors CA1 and CA2 are respectively disposed between the node NG1 and the output node NVP and between the node NG2 and the output node NVM. The capacitors CB1 and CB2 are respectively disposed between the output nodes NVP and NVM and the ground. Similarly to the fifth detailed configuration example described above, voltage excitation is performed with the excitation voltage generating circuits VF1 and VF2.

The LC tank circuits described with reference to FIGS. 11 to 27, 31, and 32 are not limited to the above configurations, but various modifications can be implemented. For example, various combinations of circuit forms such as single tank, dual tank, and coupled dual tank circuits and excitation techniques such as current excitation and voltage excitation are possible.

7. OTHER TANK CIRCUITS

Figure 33:
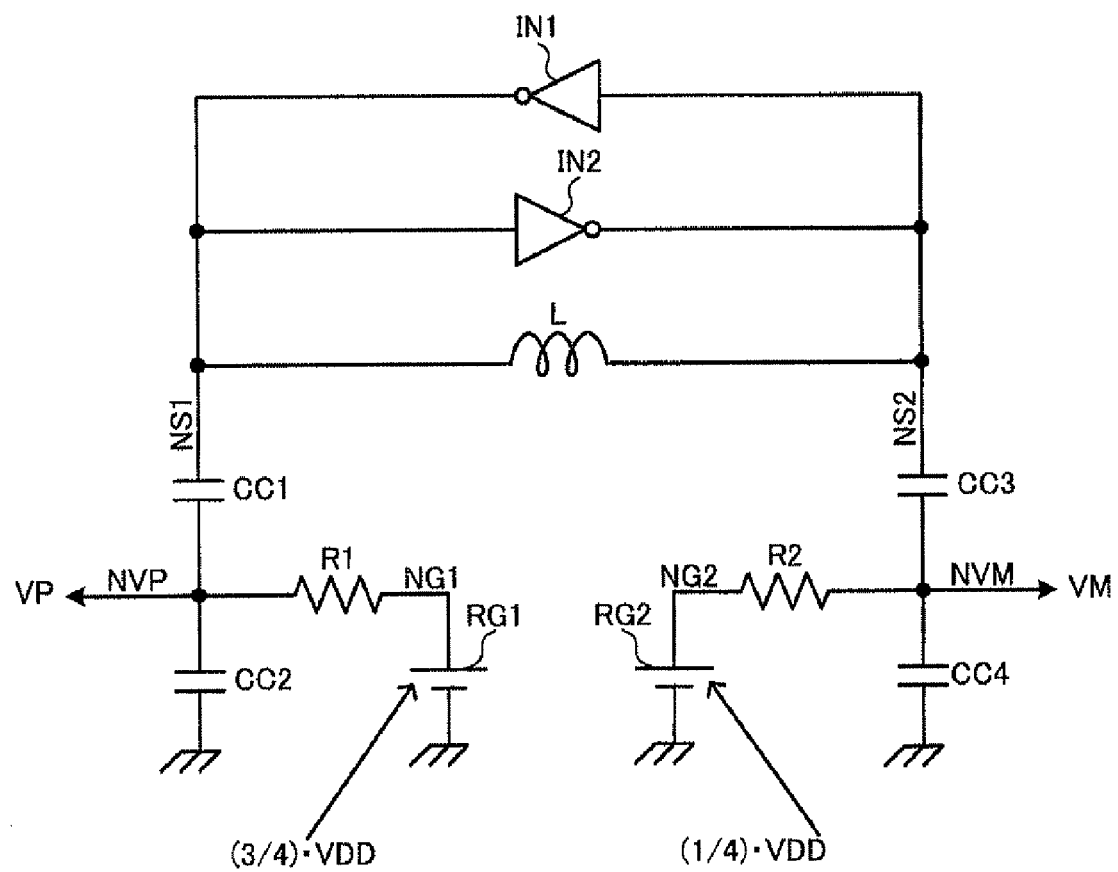
FIG. 33 shows a configuration example of a tank circuit that self-oscillates.

In the embodiment, it is also possible to supply the power supply voltages VP and VM by a tank circuit that self-oscillates other than the above LC tank circuits. FIG. 33 shows a detailed configuration example of the oscillation circuit.

The configuration example includes inverters IN1 and IN2 (oscillator in the broad sense), an inductor L, capacitors CC1 to CC4, resistor elements R1 and R2, and the reference voltage supply nodes NG1 and NG2.

The reference voltage generating circuits RG1 and RG2 respectively supply the reference voltages ¾·VDD and ¼·VDD to the output nodes NVP and NVM via the reference voltage supply nodes NG1 and NG2 and the resistor elements R1 and R2. The inverters IN1 and IN2 constitute an oscillator that excites a tank circuit. The oscillator drives nodes NS1 and NS2, so that the tank circuit outputs the power supply voltages VP and VM.

8. REFERENCE VOLTAGE GENERATING CIRCUIT

Figure 34:
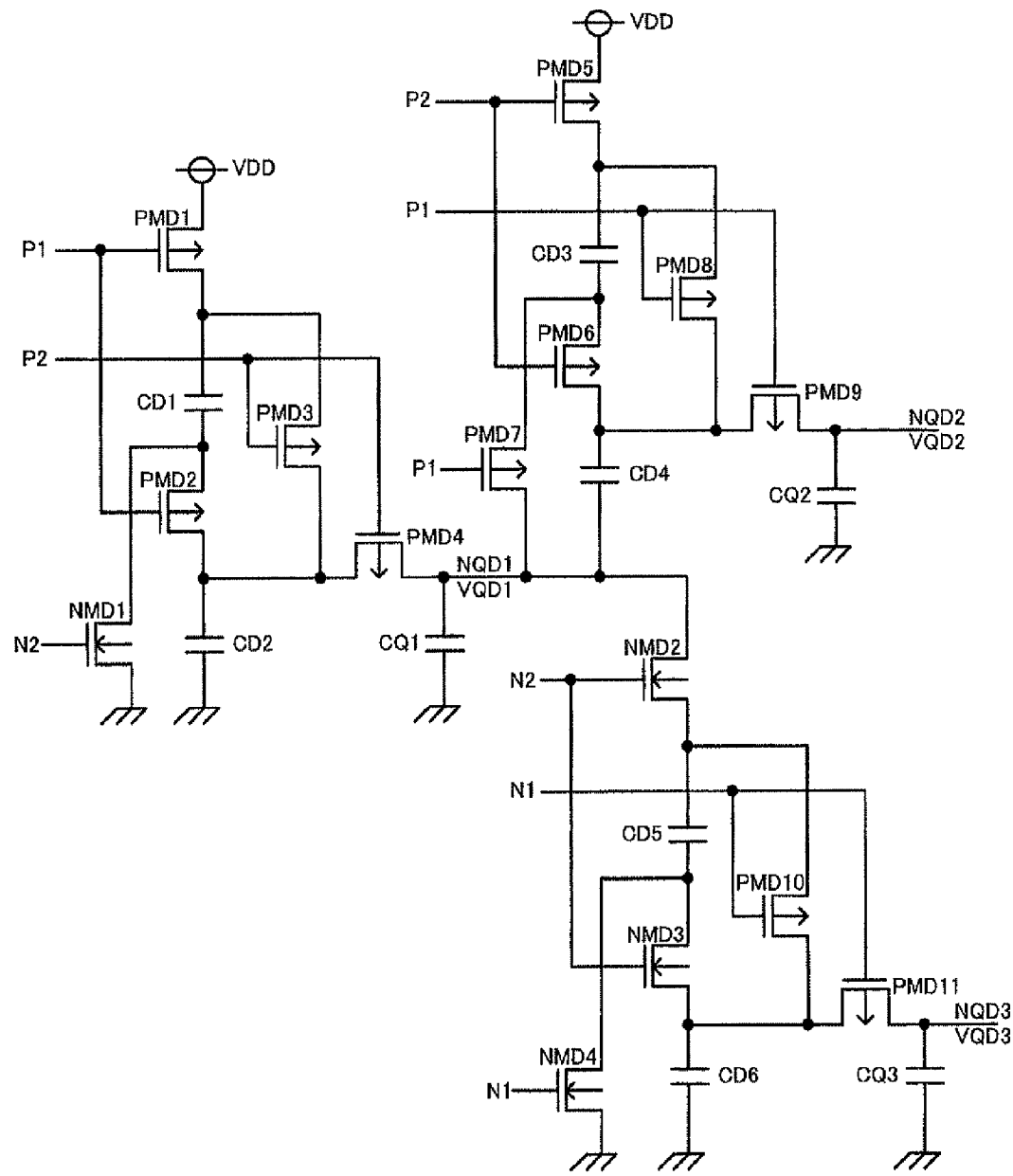
FIG. 34 shows a first detailed configuration example of the reference voltage generating circuit.

FIG. 34 shows a first detailed configuration example of a reference voltage generating circuit that outputs the reference voltages ¾·VDD (RG1) and ¼·VDD (RG2). The configuration example includes PMOS transistors PMD1 to PMD11 (first conductivity type transistors in the broad sense), NMOS transistors NMD1 to NMD4 (second conductivity type transistors in the broad sense), and capacitors CD1 to CD6 and CQ1 to CQ3. Hereinafter, for simplifying the description, the description will be made on an example in which the capacitance values of the capacitors are as follows: CD1=CD2; CD3=CD4; and CD5=CD6.

Clocks P1, P2, N1, and N2 are supplied from a not-shown control circuit or the like to the reference voltage generating circuit. The clocks P1 and P2 are clocks opposite in phase (inverted in logic level). The clocks N1 and N2 are, for example, the same clocks as the clocks P2 and P1.

When the clock P1 is at a low level, the transistors PMD1 and PMD2 are turned on, and the transistors PMD3, PMD4, and NMD1 are turned off. In this case, the capacitors CD1 and CD2 are charged between VDD and VSS. When the clock P1 is at a high level, PMD1 and PMD2 are turned off, and PMD3, PMD4, and NMD1 are turned on, so that the charge is distributed among the capacitors CD1, CD2, and CQ1. Then, a voltage VQD1=½·VDD is output to a node NQD1.

Similarly, the capacitors CD3 and CD4 are charged between VDD and ½·VDD, and the charge is distributed among the capacitors CD3, CD4 and CQ2, so that a reference voltage VQD2=¾·VDD is output to a node NQD2. Moreover, the capacitors CD5 and CD6 are charged between ½·VDD and VSS, and the charge is distributed among the capacitors CD5, CD6, and CQ3, so that a reference voltage VQD3=¼·VDD is output to a node NQD3.

Figure 30:
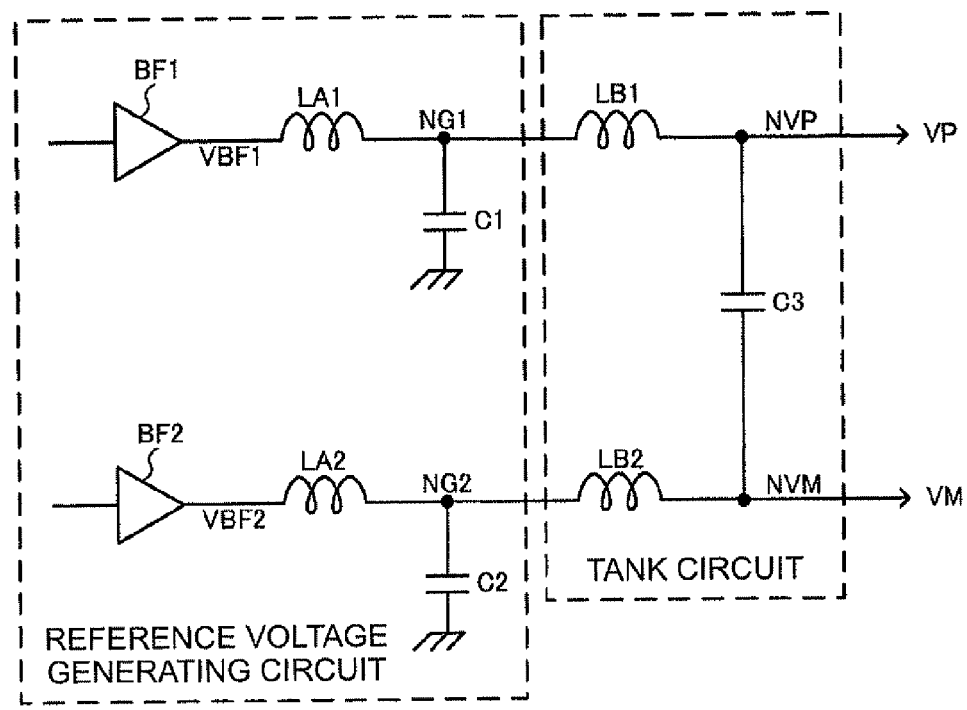
FIG. 30 shows the second detailed configuration example of the reference voltage generating circuit.

FIG. 30 shows a second detailed configuration example of the reference voltage generating circuit that generates the reference voltages ¾·VDD (RG1) and ¼·VDD (RG2). The configuration example includes drivers BF1 and BF2, inductors LA1 and LA2, the capacitors C1 and C2, and the reference voltage supply nodes NG1 and NG2. FIG. 30 also shows a tank circuit formed of inductors LB1 and LB2 and the capacitor C3.

Figure 29:
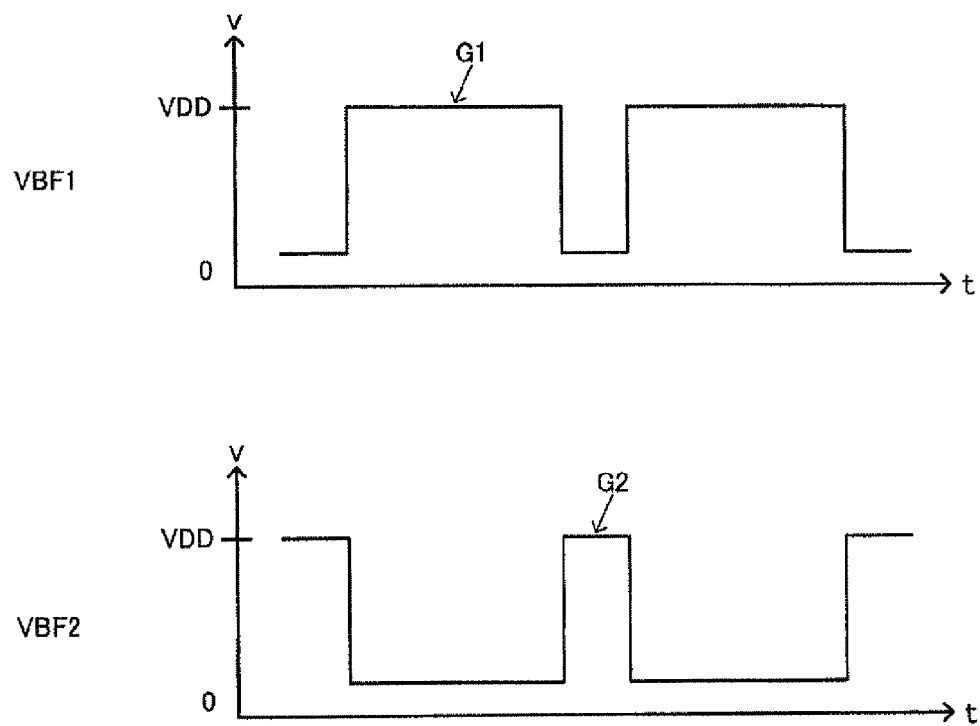
FIG. 29 shows voltage waveform examples of a second detailed configuration example of the reference voltage generating circuit.

The driver BF1 outputs a first output voltage VBF1, and the driver BF2 outputs a second output voltage VBF2, so that the reference voltages are generated. As shown by G1 in FIG. 29 for example, the driver BF1 outputs a rectangular wave in which the duty of a period during which the driver drives with VDD and a period during which the driver drives with VSS is 3:1 (a first duty). As shown by G2, the driver BF2 outputs a rectangular wave in which the duty of a period during which the driver drives with VDD and a period during which the driver drives with VSS is 1:3 (a second duty). The output voltages VBF1 and VBF2 are respectively smoothed by the inductor LA1 and the capacitor C1, and the inductor LA2 and the capacitor C2, and the reference voltages ¾·VDD and ¼·VDD are output to the nodes NG1 and NG2.

Figure 28:
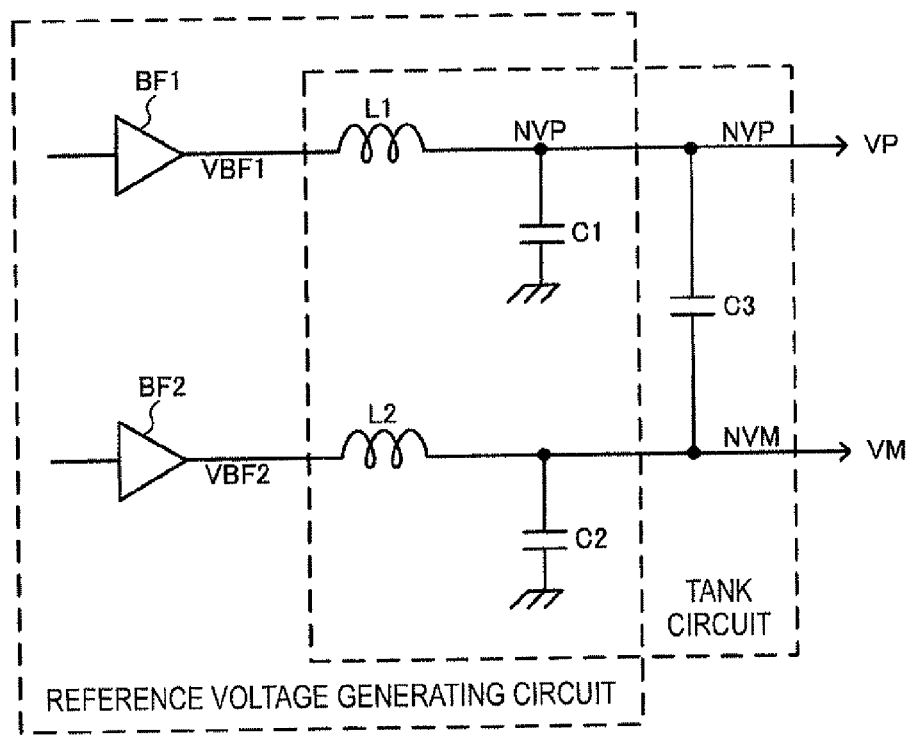
FIG. 28 shows a third detailed configuration example of a reference voltage generating circuit.

FIG. 28 shows a third detailed configuration example of the reference voltage generating circuit that generates the reference voltages ¾·VDD (RG1) and ¼·VDD (RG2). The configuration example includes the drivers BF1 and BF2, the inductors L1 and L2, and the capacitors C1 and C2. In the configuration example, the inductors L1 and L2 and the capacitors C1, C2, and C3 also constitute a tank circuit. That is, the inductors and capacitor components (LA1, LA2, etc.) are cut from the second detailed configuration example. Signals that drive the drivers BF1 and BF2 are the same as those of the second detailed configuration example.

In the second detailed configuration example and the third detailed configuration example, the duties of the drivers BF1 and BF2 are assigned so as to synchronize with resonant frequency of the tank circuit with respective duties ¾ and ¼ as centers, so that the tank circuit can also be excited.

9. CIRCUIT DEVICE

Figure 35A:
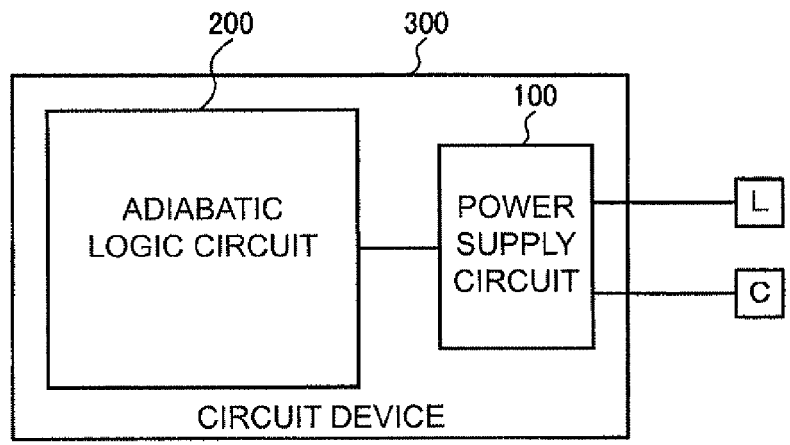
FIGS. 35A to 35C each show a configuration example of a circuit device.
Figure 35B:
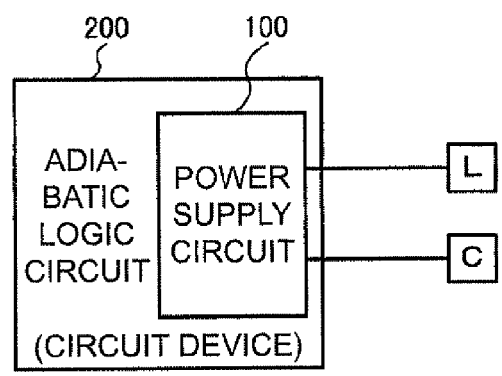
Figure 35C:
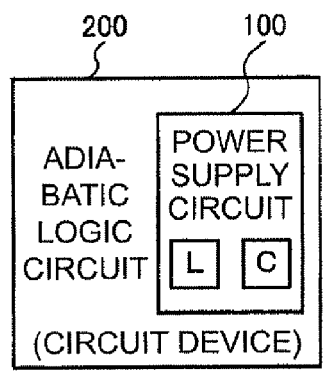

FIGS. 35A to 35C each show a configuration example of a circuit device to which the power supply circuit and adiabatic logic circuit of the embodiment can be applied.

A circuit device 300 shown in FIG. 35A includes the power supply circuit 100 and the adiabatic logic circuit 200. The power supply circuit 100 and the adiabatic logic circuit 200 are configured with separate chips (separate ICs). The inductor L and the capacitor C of the tank circuit are external to the chip of the power supply circuit 100. In the embodiment, however, at least one of L and C may be incorporated into the chip of the power supply circuit 100.

As shown in FIG. 35B, the power supply circuit 100 may be incorporated into the chip of the adiabatic logic circuit 200, so that the circuit device may be configured with one chip. The inductor L and the capacitor C of the tank circuit may be external to the chip. Alternatively, as shown in FIG. 35C, the circuit device may be configured as one chip, and the inductor L and the capacitor C of the tank circuit may be incorporated into the chip.

10. ELECTRONIC APPARATUS

Figure 36:
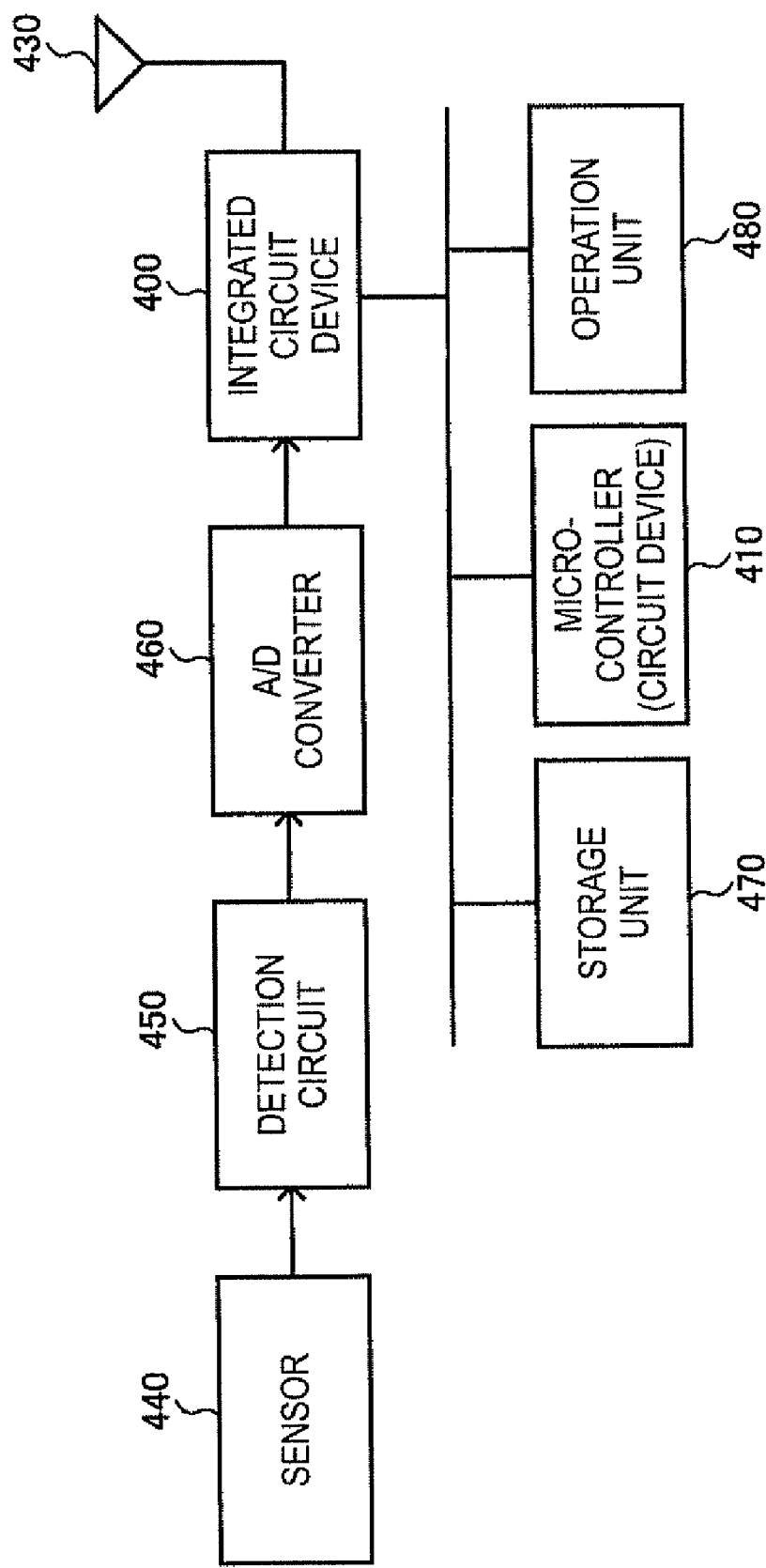
FIG. 36 shows a configuration example of an electronic apparatus.

FIG. 36 shows a configuration example of an electronic apparatus to which the circuit device of the embodiment can be applied. The electronic apparatus includes an integrated circuit device 400, a microcontroller 410 (host; a circuit device), an antenna 430, a sensor 440, a detection circuit 450, an A/D converter 460 (A/D conversion circuit), a storage unit 470, and an operation unit 480. As application examples of the electronic apparatus of the embodiment, for example, thermo-hygrometers pulsimeters, pedometers, and the like are conceivable.

The sensor 440 is configured with a sensor, for example, a temperature sensor, a humidity sensor, a gyro sensor, an acceleration sensor, a photo sensor, or a pressure sensor, according to the use of the electronic apparatus. The detection circuit 450 amplifies an output signal (sensor signal) from the sensor 440 and removes noise through a filter. The A/D converter 460 converts the amplified signal into a digital signal and outputs the digital signal to the integrated circuit device 400. The integrated circuit device 400 processes the output signal from the sensor 440 and radio-transmits the processed signal from the antenna 430. The microcontroller 410 is configured with an adiabatic logic circuit or the like, and performs digital signal processing or controlling processing of the electronic apparatus based on setting information stored in the storage unit 470 and an signal from the operation unit 480. The storage unit 470 is configured with, for example, a flash memory and stores the setting information, detected data, and the like. The operation unit 480 is configured with, for example, a keypad or the like and used for operating the electronic apparatus by a user.

Although the embodiment has been described above in detail, those skilled in the art should readily understand that many modifications can be made without substantially departing from the novel matter and effect of the invention. Accordingly, those modified examples are also included in the scope of the invention. For example, the terms (VDD, VSS, etc.) that are described at least once in association with different terms in the broader sense or equivalent terms (the first DC voltage, the second DC voltage, etc.) in the specification or drawings can be replaced with these different terms anywhere in the specification or drawings. Moreover, the configuration and operation of the power supply circuit, the adiabatic logic circuit, the circuit device, the electronic apparatus, and the like are not limited to those described in the embodiment, and various modifications can be implemented.

What is claimed is:
1. A circuit device comprising:
a power supply circuit; and
a logic circuit,
the power supply circuit supplying a first power supply voltage and a second power supply voltage to the logic circuit,
the first power supply voltage supplied by the power supply circuit periodically changing with a first reference voltage as a reference voltage,
the second power supply voltage supplied by the power supply circuit periodically changing with a second reference voltage as a reference voltage, the first reference voltage and the second reference voltage being different reference voltages from each other, the power supply circuit supplying, due to resonance, the first power supply voltage and the second power supply voltage that repeat a first period during which a voltage difference between the first power supply voltage and the second power supply voltage is decreasing and a second period during which the voltage difference is increasing, and the logic circuit performing adiabatic circuit operation with the supply of the first power supply voltage and the second power supply voltage.

2. A circuit device comprising:
a power supply circuit; and
a logic circuit,
the power supply circuit supplying a first power supply voltage and a second power supply voltage to the logic circuit,
the first power supply voltage periodically changing with a first reference voltage as a reference voltage,
the second power supply voltage periodically changing with a second reference voltage as a reference voltage,
the first reference voltage and the second reference voltage being different reference voltages from each other,
the first power supply voltage and the second power supply voltage repeating a first period during which a voltage difference between the first power supply voltage and the second power supply voltage is decreasing and a second period during which the voltage difference is increasing,
the second power supply voltage becoming a local maximum value during a period between a first local maximum value of the first power supply voltage and a second local maximum value subsequent to the first local maximum value, and becoming a local minimum value during a period between a first local minimum value of the first power supply voltage and a second local minimum value subsequent to the first local minimum value, and
the logic circuit performing adiabatic circuit operation with the supply of the first power supply voltage and the second power supply voltage.

3. The circuit device according to claim 1,
the logic circuit including an inverter,
the first power supply voltage being supplied to a source electrode of a first conductivity type transistor of the inverter not via another active element, and
the second power supply voltage being supplied to a source electrode of a second conductivity type transistor of the inverter not via another active element.

4. The circuit device according to claim 1,
the first power supply voltage and the second power supply voltage being sine waves opposite in phase with each other.

5. The circuit device according to claim 1,
the logic circuit having a first conductivity type transistor and a second conductivity type transistor, and
the first power supply voltage and the second power supply voltage having a minimum voltage difference that is smaller than a threshold voltage of the first conductivity type transistor and a threshold voltage of the second conductivity type transistor.

6. The circuit device according to claim 1,
the logic circuit being input with an input signal having an edge during the second period.

7. The circuit device according to claim 1,
the first power supply voltage and the second power supply voltage being sine waves opposite in phase from each other, and
the logic circuit being input with an input signal having an edge at a timing in which a voltage difference between the first power supply voltage and the second power supply voltage is minimized.

8. The circuit device according to claim 1,
the first power supply voltage and the second power supply voltage being generated by one tank circuit.

9. The circuit device according to claim 8,
the tank circuit being configured with a capacitor, a first inductor, and a second inductor,
the power supply circuit outputting the first power supply voltage from a first output node of the tank circuit and outputting the second power supply voltage from a second output node,
the capacitor being disposed between the first output node and the second output node,
the first inductor being connected at one end to the first output node, and
the second inductor being connected at one end to the second output node.

10. The circuit device according to claim 9,
the power supply circuit having at least one of an exciting transistor whose one end is connected to the first output node and an exciting transistor whose one end is connected to the second output node.

11. The circuit device according to claim 9,
the power supply circuit having a first reference voltage generating circuit that supplies the first reference voltage to the other end of the first inductor and a second reference voltage generating circuit that supplies the second reference voltage to the other end of the second inductor.

12. The circuit device according to claim 9,
the power supply circuit having a first driver whose duty of a period during which the first driver drives with a first DC voltage and a period during which it drives with a second DC voltage is set to a first duty and a second driver whose duty of a period during which the second driver drives with the first DC voltage and a period during which it drives with the second DC voltage is set to a second duty,
the first driver being set with the first duty as a duty for setting the first reference voltage and outputting a first output voltage to the other end of the first inductor, and
the second driver being set with the second duty, different from the first duty, as a duty for setting the second reference voltage and outputting a second output voltage to the other end of the second inductor.

13. The circuit device according to claim 1,
the first power supply voltage being generated by a first tank circuit, and
the second power supply voltage being generated by a second tank circuit.

14. The circuit device according to claim 13,
the first tank circuit being configured with a first capacitor and a first inductor,
the second tank circuit being configured with a second capacitor and a second inductor,
the power supply circuit outputting the first power supply voltage from a first output node of the first tank circuit and outputting the second power supply voltage from a second output node of the second tank circuit, the first capacitor being disposed between the first output node and a ground node, the first inductor being connected at one end to the first output node, the second capacitor being disposed between the second output node and the ground node, and the second inductor being connected at one end to the second output node.

15. An electronic apparatus comprising the circuit device according to claim 1.

16. A power supply method that supplies power supply voltages to a logic circuit, comprising:

supplying to the logic circuit a first power supply voltage and a second power supply voltage for performing adiabatic circuit operation by the logic circuit;

supplying, as the first power supply voltage, a voltage that periodically changes with a first reference voltage as a reference voltage;

supplying, as the second power supply voltage, a voltage that periodically changes with a second reference voltage as a reference voltage where the first reference voltage and the second reference voltage are different reference voltages from each other; and supplying, due to resonance, the first power supply voltage and the second power supply voltage that repeat a first period during which a voltage difference between the first power supply voltage and the second power supply voltage is decreasing and a second period during which the voltage difference is increasing.

* * * * *